(12) United States Patent
Onodera

(10) Patent No.: US 8,683,401 B2
(45) Date of Patent: Mar. 25, 2014

(54) INFORMATION PROCESSING DEVICE AND DESIGN SUPPORTING METHOD

(75) Inventor: Mitsuru Onodera, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 93 days.

(21) Appl. No.: 13/177,096

(22) Filed: Jul. 6, 2011

(65) Prior Publication Data

US 2012/0036490 A1 Feb. 9, 2012

(30) Foreign Application Priority Data

Aug. 6, 2010 (JP) ................................. 2010-177186

(51) Int. Cl.
*G06F 17/50* (2006.01)
*G06F 9/455* (2006.01)

(52) U.S. Cl.
USPC ........................... 716/108; 716/113; 716/134

(58) Field of Classification Search
USPC ......................................... 716/108, 113, 134
See application file for complete search history.

(56) References Cited

U.S. PATENT DOCUMENTS

| | | | |
|---|---|---|---|
| 5,396,615 A | 3/1995 | Tani | |
| 7,930,674 B2 * | 4/2011 | Parker et al. | 716/134 |
| 2002/0037596 A1 | 3/2002 | Yamaguchi | |
| 2004/0254776 A1 * | 12/2004 | Andou | 703/19 |
| 2007/0150847 A1 * | 6/2007 | Ikeda | 716/13 |
| 2009/0043558 A1 * | 2/2009 | Komoda | 703/14 |
| 2009/0183132 A1 | 7/2009 | Izuha et al. | |
| 2010/0030516 A1 * | 2/2010 | Kambara et al. | 702/179 |

FOREIGN PATENT DOCUMENTS

| | | |
|---|---|---|
| JP | 05-040801 A | 2/1993 |
| JP | 06-332974 A | 12/1994 |
| JP | 2001-168200 A | 6/2001 |
| JP | 2002-110489 A | 4/2002 |
| JP | 2005-019524 A | 1/2005 |
| JP | 2008-134826 A | 6/2008 |
| JP | 2009-163655 A | 7/2009 |

OTHER PUBLICATIONS

Cao et al.; "Mapping Statistical Process Variations Toward Circuit Performance Variability: An Analytical Modeling Approach"; Oct. 2007; IEEE Transactions on Computer-Aided Design of Integrated Circuits and Systems, vol. 26, No. 10; pp. 1-8.*
Japanese Notice of Reason for Rejection, Japanese Patent Application No. 2010-177186 dated Oct. 29, 2013.
Kenichi Okada et al., "A Statistical Timing Analysis with Intra-Chip Manufacturing Valiability", Technical Report of IEICE, The Institute of Electronics, Information and Communication Engineers, Nov. 30, 2001, vol. 101, No. 471, pp. 7-12.

\* cited by examiner

*Primary Examiner* — Suresh Memula
(74) *Attorney, Agent, or Firm* — Arent Fox LLP

(57) ABSTRACT

An information processing device comprises, a physical property value generation unit to generate a plurality of physical property values for changing signal propagation time of a target path including a plurality of circuit elements within a predetermined fluctuation range, an element delay calculation unit to calculate delay time of each of signals passing through the circuit element in accordance with each of the generated physical property values and a propagation time calculation unit to calculate the signal propagation time of the target path on the basis of the delay time of the signals.

18 Claims, 34 Drawing Sheets

FIG. 15

| TIME | INPUT VOLTAGE (Vin) | OUTPUT CURRENT (Ids) | OUTPUT VOLTAGE (Vds) |
|---|---|---|---|
| 0 | : | : | : |
| : | : | : | : |

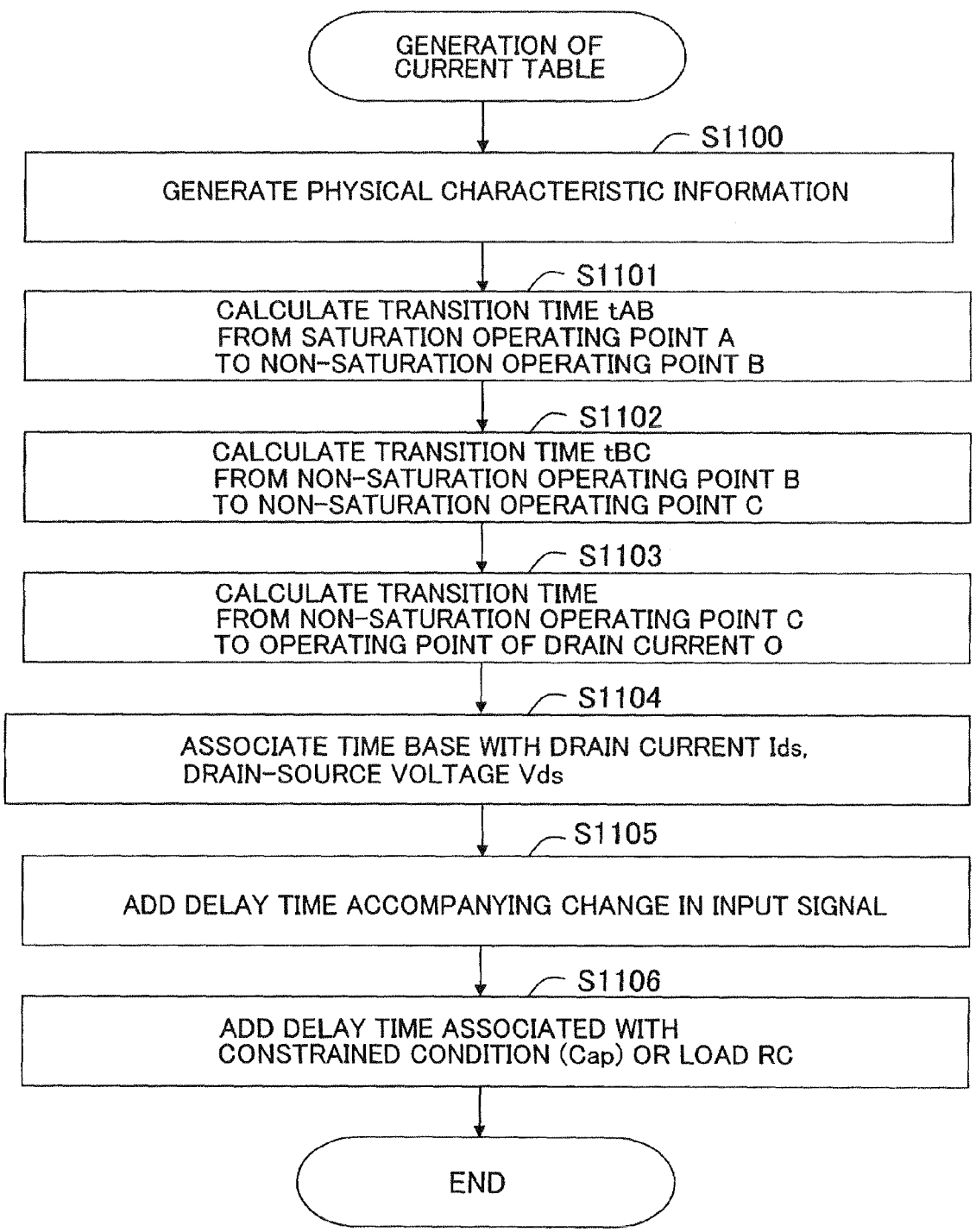

DELAY ERROR DUE TO DIFFERENCE OF
DETERMINATION VALUE OF SIGNAL LEVEL

IF SIGNAL LEVEL DETERMINATION VALUE
OF POSTERIOR CELL IS DIFFERENT,
SET SIGNAL LEVEL DETERMINATION VALUE
OF ANTERIOR CELL AS SIGNAL LEVEL
DETERMINATION VALUE OF POSTERIOR CELL

INFORMATION PROCESSING DEVICE AND DESIGN SUPPORTING METHOD

CROSS-REFERENCE TO RELATED APPLICATION

This application is based upon and claims the benefit of prior Japanese Patent Application No. 2010-177186 filed on Aug. 6, 2010, the entire contents of which are incorporated herein by reference.

FIELD

The embodiment discussed herein is related to a timing analysis of an integrated circuit.

BACKGROUND

In a semiconductor integrated circuit, there is a case in which an integrated circuit does not normally operate if delay time of a circuit within the integrated circuit does not satisfy a specified condition. On the other hand, in manufacturing the integrated circuit, a circuit characteristic accompanies a variation due to a manufacturing condition etc. As a result, a variation occurs in the delay time of a circuit within the integrated circuit to be manufactured. Such being the case, for designing the integrated circuit, a designer verifies based on timing analysis whether the circuit in the integrated circuit normally operates or not by setting an allowable value of the delay time after taking account of a margin to some extent in the delay time of the circuit within the integrated circuit.

A conventional technique known in the timing analysis for designing the integrated circuit is a technique of statistically processing the variation of the delay time of the circuit within the integrated circuit. SSTA (Statistical Static Timing Analysis) is proposed as an analyzing method of statistically processing the delay time of the circuit.

The SSTA involves receiving a feedback from a measurement result of the delay time of each of a variety of integrated circuits manufactured on, e.g., various manufacturing lines and obtaining a delay time distribution of the circuit. Therefore, when putting a focus on one single integrated circuit, there is a case where the variation of the delay time of the integrated circuit is not coincident with the variation of the delay time on the manufacturing line for the variety of integrated circuits. Consequently, the circuit within the focused integrated circuit contains a possibility of setting an excessive margin (or deficiency of margin) in the delay time.

[Patent document 1] Japanese Laid-open Patent Publication No. 2005-19524

[Patent document 2] Japanese Laid-open Patent Publication No. 2008-134826

[Patent document 3] Japanese Laid-open Patent Publication No. 2002-110489

SUMMARY

The related art uses information obtained by statistically processing the periods of delay time given from the variety of manufacturing lines, and hence a technique is not proposed, which handles the variation of the delay time due to a fluctuation of the circuit characteristic of the individual circuit of the design target integrated circuit at a design stage of the integrated circuit.

One aspect of an embodiment is exemplified by an information processing device which follows. The information processing device includes: a physical property value generation unit to generate a plurality of physical property values for changing signal propagation time of a target path including a plurality of circuit elements within a predetermined fluctuation range; an element delay calculation unit to calculate delay time of each of signals passing through the circuit element in accordance with each of the generated physical property values; and a propagation time calculation unit to calculate the signal propagation time of the target path on the basis of the delay time of the signals. A program, which makes a computer and other machines and devices (which will hereinafter be generically termed the computer etc) realize any one of the functions described above, may be recorded on a recording medium that can be read by the computer etc.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 15 is a diagram illustrating structure of a current table.

FIG. 23 is a flowchart illustrating details of a process of generating the current table.

DESCRIPTION OF EMBODIMENT

A design supporting device according to one embodiment will hereinafter be described with reference to the drawings. A configuration in the following embodiment is an exemplification, and the present device is not limited to the configuration in the embodiment.

COMPARATIVE EXAMPLE

Figure 1:
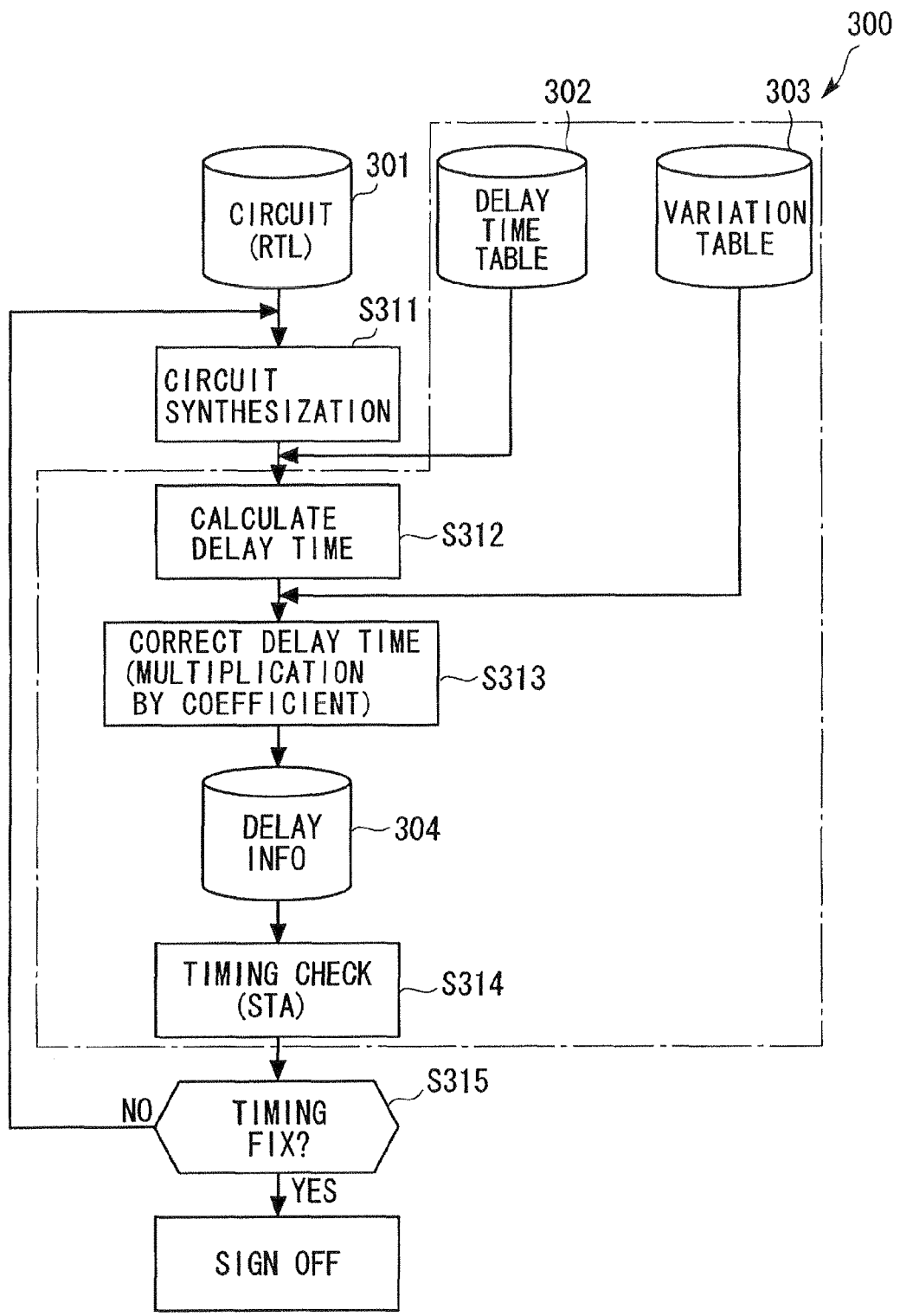
FIG. 1 is a diagram illustrating a processing procedure of a design supporting device according to a comparative example.

An outline of SSTA (Statistical Static Timing Analysis) executed by the design supporting device in a comparative example will hereinafter be described with reference to FIGS. 1-4. FIG. 1 is a diagram illustrating a processing procedure of a design supporting device 300 according to the comparative example.

A technique for analyzing delay time of a circuit involves using STA (Static Timing Analysis) in some cases. In the case of applying the STA, the design supporting device 300 configures a path in a manner that houses elements in, e.g., a black box. Then, the design supporting device 300 obtains delay time of the path by taking into consideration an actually-implausible case or a low-possibility occurrence case, and thus determines whether a predetermined condition is satisfied or not. The timing analysis is performed in a way that includes these extreme cases, which is easy to result in ensuring an excessive margin at a design stage.

The SSTA is proposed as one technique for relaxing the excessive margin such as this. According to the SSTA, a variation (dispersion) in delay time of the element is given as a statistic. "Bing given as the statistic" is exemplified such that a delay time distribution of a certain element G1 is set as a probability distribution function f1. The probability distribution function f1 may be exemplified as a normal distribution of a mean m1 and a standard deviation s1. Similarly, the delay time distribution of a certain element G2 is set as a probability distribution function f2. The probability distribution function f2 can be exemplified as the normal distribution of a mean m2 and a standard deviation s2. Then, for example, a substitute for setting a sum of periods of simple delay time as time of a path P established by connecting the elements G1 and G2 in series, involves seeking a probability distribution function fa acquired from a statistical sum of the probability distribution functions f1 and f2. Then, an error occurrence frequency of the path P is calculated by use of the probability distribution function fa, and a condition for the element delay time is relaxed up to such a point that the error occurrence frequency satisfies a given condition.

As illustrated in FIG. 1, the design supporting device 300 retains, in a storage device, circuit data 301 described in RTL (Register Transfer Level), a delay time table 302 in which to define the delay time of the element contained in a design circuit and a variation table 303 in which to define a variation (dispersion), e.g., a standard deviation of the delay time.

The circuit data 301 expresses a design target integrated circuit. In the RTL, however, pieces of gate-level hardware such as a flip-flop, AND and OR are abstracted. Accordingly, the circuit data 301 defines an information transfer between the registers such as the transfer of the information like X=A·B, i.e., defines such design data that an AND operation result between a register A and a register B is inputted to a register X, but does not include a gate configuration.

The delay time table 302 retains pieces of information for identifying the respective elements and delay time of each element.

As in FIG. 1, the design supporting device 300 executes circuit synthesization (Synthesis) based on the circuit data 301 (RTL) (S311). As a result of the circuit synthesization, a gate-level netlist is generated based on the RTL. The gate-level netlist includes gates contained in the circuit and information of connection between the gates.

Then, the design supporting device 300 calculates, based on the gate-level netlist and the delay time table 302, the delay time of each of paths within the design target integrated circuit (S312). In a comparative example, the design supporting device 300 applies the SSTA. Namely, the design supporting device 300, as described above, for instance, corrects the delay time with respect to series circuits of a plurality of gates (S313). The correction of the delay time is based on an effect of statistical addition in place of performing, e.g., the simple addition of the delay time. As a result of correcting the delay time, the design supporting device 300 determines a coefficient for relaxing the delay time of each element. Then, the design supporting device 300 sets delay time information (Delay Info) 304 with respect to the individual gates within the gate-level netlist.

Then, the design supporting device 300 executes, based on the delay time information 304 set in regard to each gate, the STA (S314) and determines whether or not the delay time of each of the paths within the design target integrated circuit satisfies a given condition (S315). If any path exists in which the delay time does not satisfy the given condition, the design supporting device 300 loops the processing back to S311, then changes a setting condition and again executes the circuit synthesization. The setting condition connotes setting a cost function for the circuit synthesization, setting an upper limit of a gate count and setting an upper limit of a gate size, etc. While on the other hand, if the delay time of each of the paths within the design target integrated circuit satisfies the given condition, it follows that the design is ended (S315). The "end of the design" is also called "sign-off" in a sense of a stage at which a user and a maker of the integrated circuit mutually checks the correctness of the design.

Figure 2:
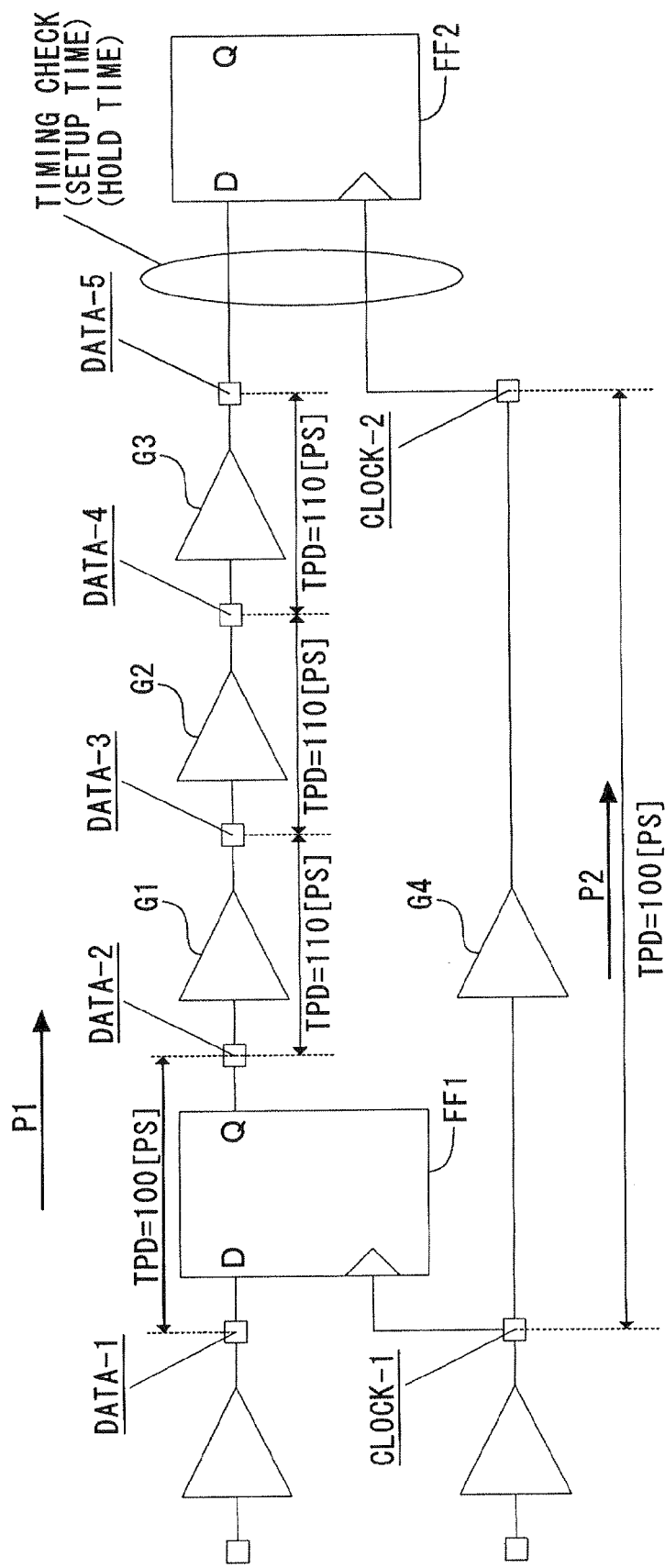
FIG. 2 is a diagram illustrating a design target integrated circuit.

FIGS. 2-5 illustrate processing examples of the design supporting device 300. FIG. 2 depicts an example of the design target integrated circuit. FIG. 2 is a diagram illustrating a connecting relation between the gates on the basis of the netlist in the form of a circuit diagram. Herein, the discussion will proceed by taking an example of timing verification about a path P1 extending from a flip-flop FF1 via gates G1-G3 to a flip-flop FF2 and a path P2 extending via a gate G4 in the integrated circuit of FIG. 2. In FIG. 2, the path P1 is a path for transferring and receiving the data between the flip-flops FF1 and FF2. Further, the path P2 is a path for clock signals supplied to the flip-flops FF1 and FF2. Herein, the timing verification may be exemplified by verifying setup time and hold time of the flip-flop FF2, which are calculated based on a relation between the signal transmitted via the path P1 and the clock signal transmitted via the path P2.

Now, an assumption is that the delay time of the flip-flop FF1 is 100 ps, and the delay time of each of the gates G1-G3 is 110 ps. Herein, the delay time is to imply signal propagation time from an input terminal to an output terminal of each element. Further, in FIG. 2, the propagation time via a metal wire between the elements is ignored. The metal wire is also referred to as a transmission path. Both of the hold time and the setup time of the flip-flops FF1 and FF2 are set to 200 ps.

Figure 3:
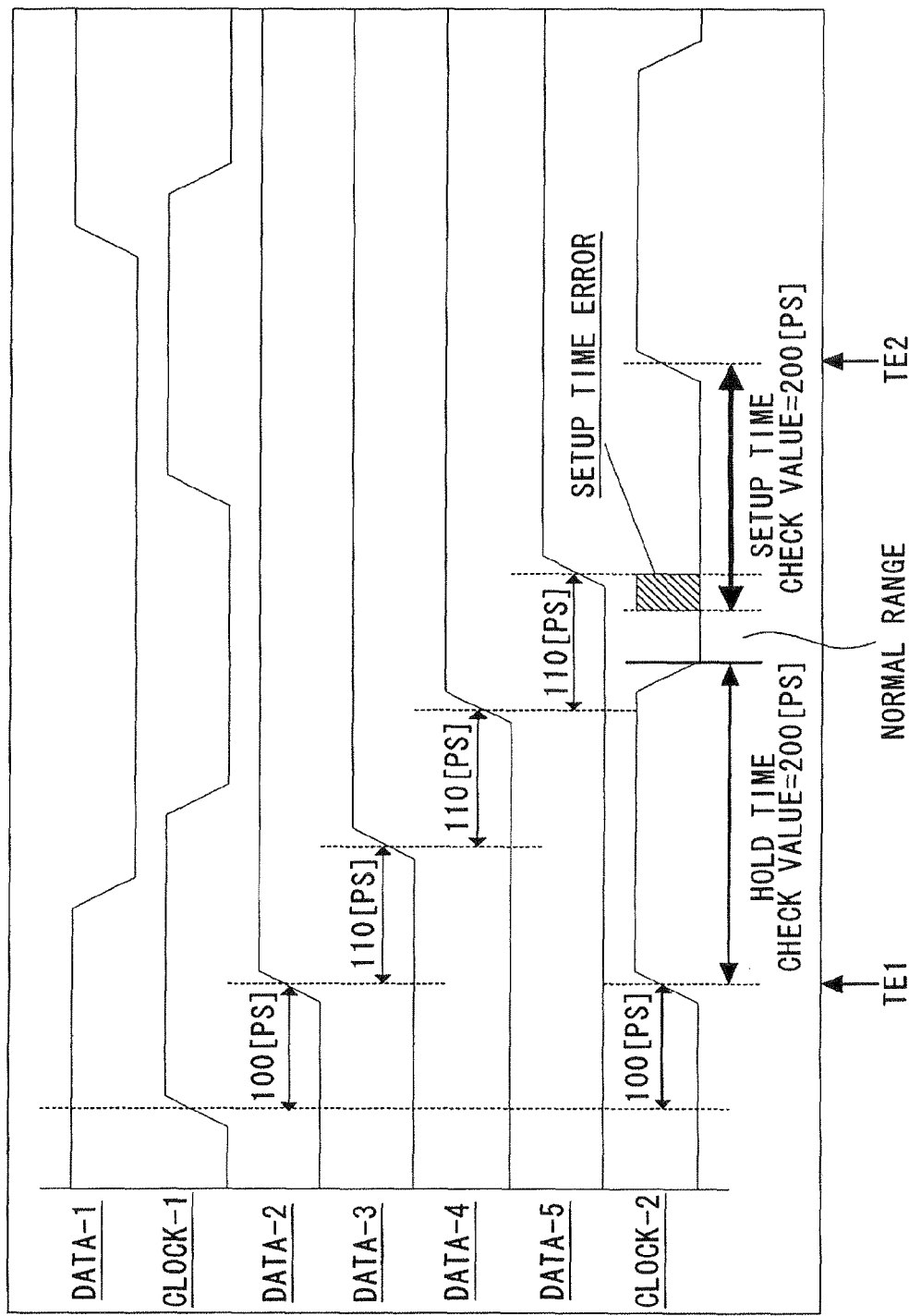
FIG. 3 is a timing chart illustrating a result of timing verification.

FIG. 3 is a timing chart illustrating a result of the timing verification with respect to the integrated circuit of FIG. 2. Signals Data-1 through Data-5 in FIG. 3 correspond to signals in positions indicated by Data-1 through Data-5 in the circuit diagram of FIG. 2. The timing chart in FIG. 3 illustrates a check value of the setup time and a check value of the hold time of the input signal to the flip-flop FF2. Now, it is presumed that the data is captured from the input terminals of flip-flops FF1, FF2 at rising edges of clocks Clock-1, Clock-2. In FIG. 3, the input signal Data-5 to the flip-flop FF2 is captured at a rising edge TE1 of the clock signal Clock-2. Then, the input signal Data-5 captured at the rising edge TE1 continues longer than the check value 200 ps of the hold time. Accordingly, the input signal Data-5 satisfies the check value of the hold time. On the other hand, the setup time at the timing when the input signal Data-5 is captured next, i.e., the setup time before the rising edge TE2 of the clock signal Clock-2 is shorter than the check value 200 ps, and the check value of the setup time is not satisfied. Therefore, a setup error is detected. Note that [Normal Range] illustrated in FIG. 3 is defined as an interval in which Data-5 is switched over to HI (High Voltage) from LO (Low Voltage) because of Data-5 being normally captured by the flip-flop FF2.

Figure 4:
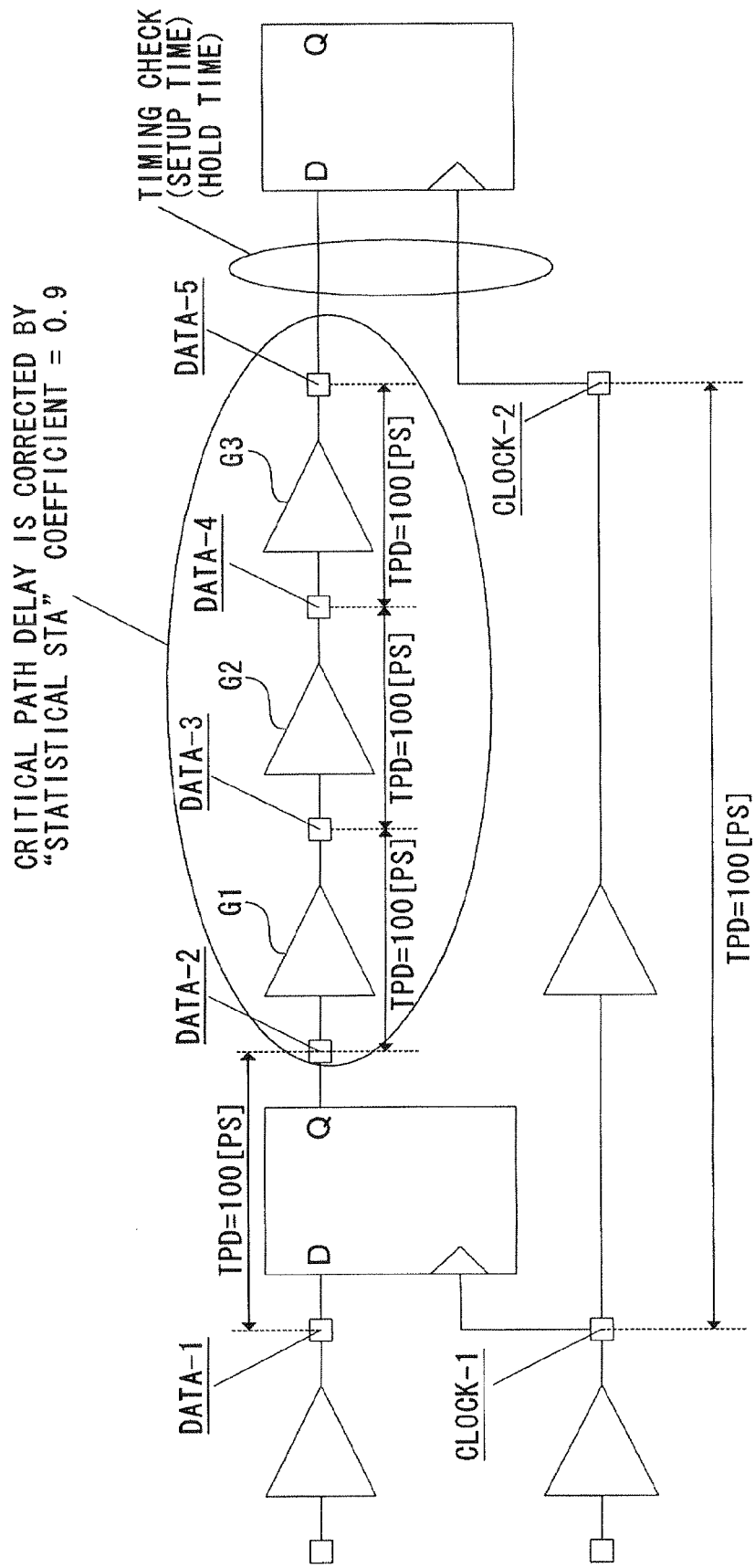
FIG. 4 is a diagram illustrating an SSTA-based analyzing procedure.

FIG. 4 is a diagram illustrating an analyzing procedure to which the SSTA is applied. In an example in FIG. 4, by way of one design technique, a focus is put on a path (buffer 3 stages) connecting with data of a second stage of the flip-flop FF2. A path delay is multiplied by a correction value (a multiple is 0.9 in this example) obtained from the statistics about this path. A coefficient multiplication process of this correction value corresponds to step S313 in FIG. 1. This correction value is obtained by statically processing empirical values etc based on, e.g., manufacturing results in a factory. The correction value is determined to be a value assumed so that an error occurrence rate of the element satisfies a given limit even by correcting, for example, the delay time of the on-path element on the basis of a correction value multiple (which is 0.9-fold in this example) and reducing the margin. A specific method of acquiring a relaxation coefficient differs depending on a vendor of the semiconductor.

Figure 5:
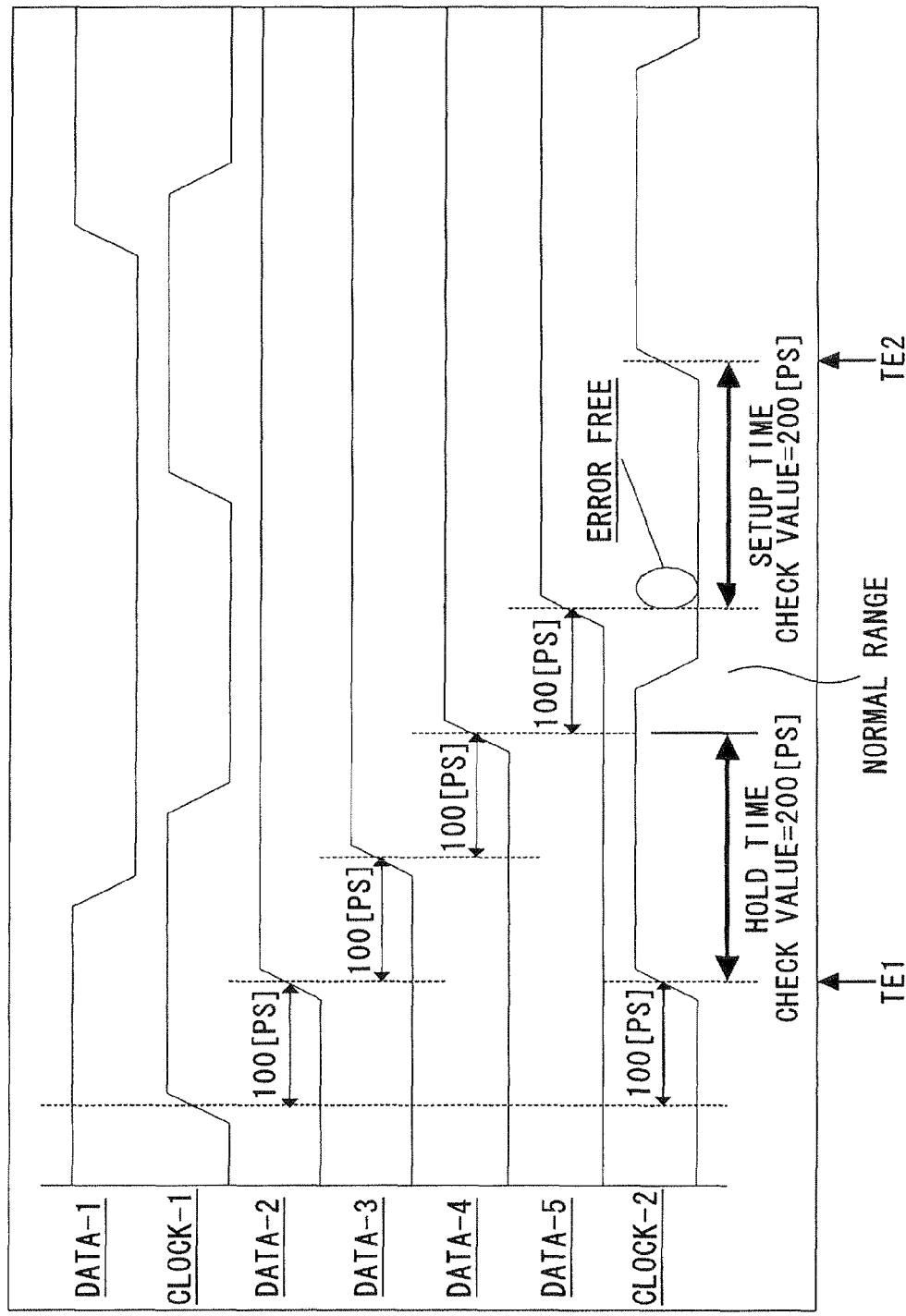
FIG. 5 is a timing chart illustrating a result of the timing analysis.

FIG. 5 is a timing chart illustrating a result of the timing analysis in the integrated circuit of FIG. 4. As in FIG. 5, in the delay-time corrected status, the delay time of each of the gates G1-G3 becomes 100 ps, as a result of which both of the hold time from the rising edge TE1 of the input signal Data-5 and the setup time before the rising edge TE2 satisfy the check value 200 ps. Accordingly, when implementing the timing analysis in the integrated circuit depicted in FIG. 4, the setup error disappears.

The coefficient of the correction value, which is exemplified in the relaxation of the specifications (specs), is, for instance, a statically acquired value from a tendency of the manufacturing variations obtained from other sample chips. Accordingly, the relaxation of the specs based on the coefficient multiplication corresponds on an actual basis to a scheme that the tendency of the manufacturing variations acquired from other sample chips is applied to the timing check target, i.e., the design target integrated circuit. Hence, such an assumption that [with respect to the design target integrated circuit, the specs are satisfied when an intra-chip variation presumed at the design stage occurs] is not of a generalized assurance.

FIRST WORKING EXAMPLE

Figure 6:
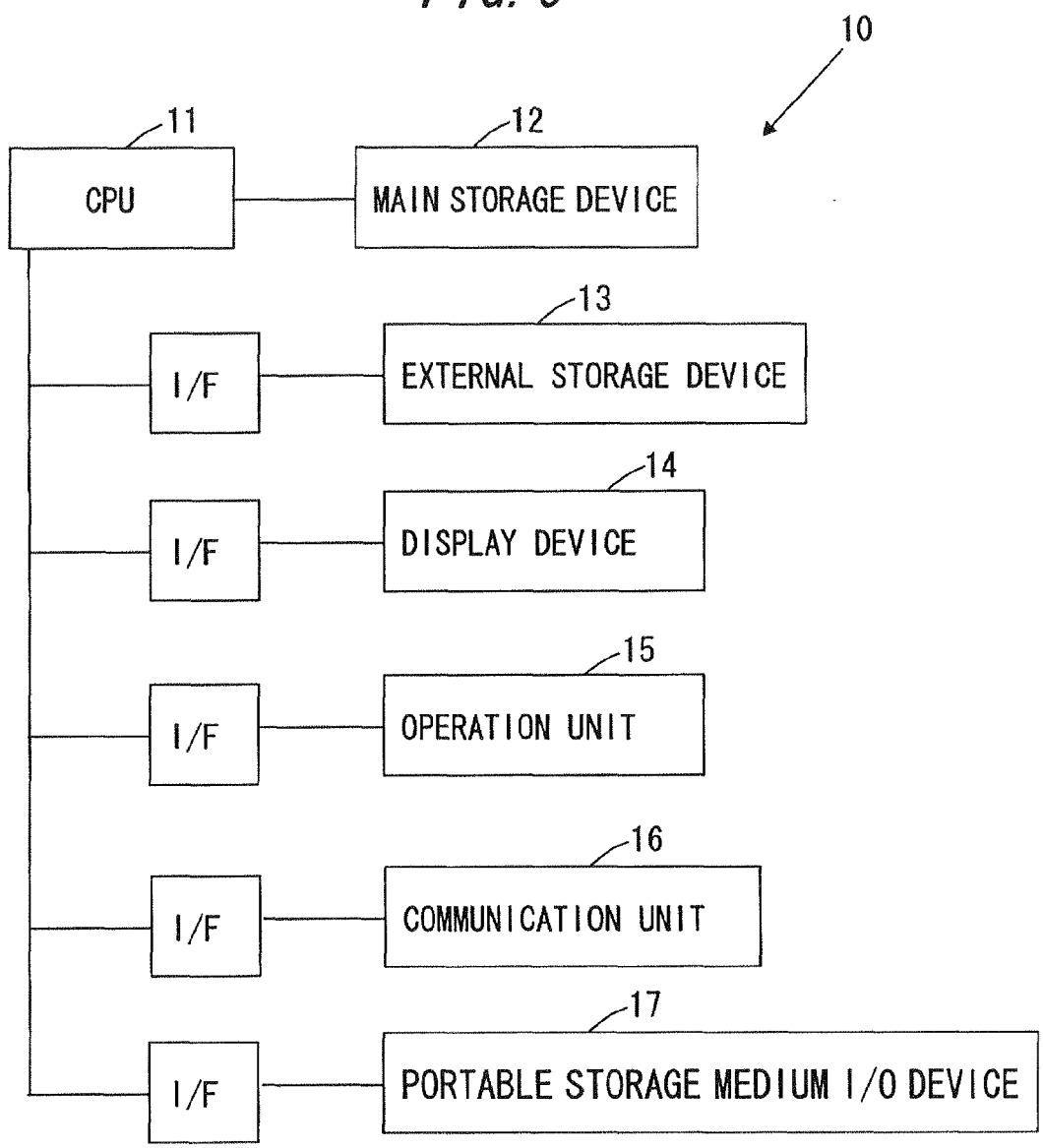
FIG. 6 is a diagram illustrating a hardware configuration of the design supporting device.

A design supporting device 10 according to a first working example will hereinafter be described with reference to FIGS. 6 through 10. The design supporting device 10 may be called an information processing device and is exemplified such as a personal computer or a server, etc. FIG. 6 illustrates a hardware configuration of the design supporting device 10. The design supporting device 10 includes a CPU (Central Processing Unit) 11 and a main storage device 12, and is, further, connected via interfaces to an external storage device 13, a display device 14, an operation unit 15, a communication unit 16, a portable storage medium I/O device 17, etc.

The CPU 11 is called a processor. The CPU 11 executes a computer program deployed in an execution-enabled status on a memory 12, thereby providing functions of the design supporting device 10. The CPU 11 is not limited to a single core type of including a single execution device for executing instruction but may also be of a so-called multicore type.

The main storage device 12 is called a memory. The main storage device 12 is stored with the computer program executed by the CPU 11 and data processed by the CPU 11. The main storage device 12 may include a nonvolatile ROM (Read Only Memory) and a volatile DRAM (Dynamic Random Access Memory). The external storage device 13 is called a secondary storage device as the case may be. The external storage device 13 is a storage device based on, e.g., a hard disk drive. The external storage device 13 may, however, be a solid-state drive (SSD) etc based on a flash memory or the like.

The display device 14 is exemplified such as a liquid crystal display, an electroluminescence panel, a plasma display, etc. The operation unit 15 is an input device such as a keyboard, a mouse, a touch panel and an electrostatic pad. The electrostatic pad is a device used for a user to trace on a flat pad with a finger, in which the user's operation is detected, and a position and a moving state of a cursor on the display are controlled corresponding to the user's operation. For example, a finger motion of the user is detected from a change in electrostatic capacitance of an electrode provided under the flat pad.

The communication unit 16 is, e.g., a connection interface with LAN, i.e., what is called NIC (Network Interface Card).

Further, the communication unit 16 may also be an interface with wireless LAN (Local Area Network).

The portable storage medium I/O device 17 is defined as a data input/output device to an attachable/detachable storage medium. The portable storage medium I/O device 17 is exemplified by an I/O device to a flash memory card and an I/O device to a CD (Compact Disc), a DVD (Digital Versatile Disk) and a Blu-ray disc.

Figure 7:
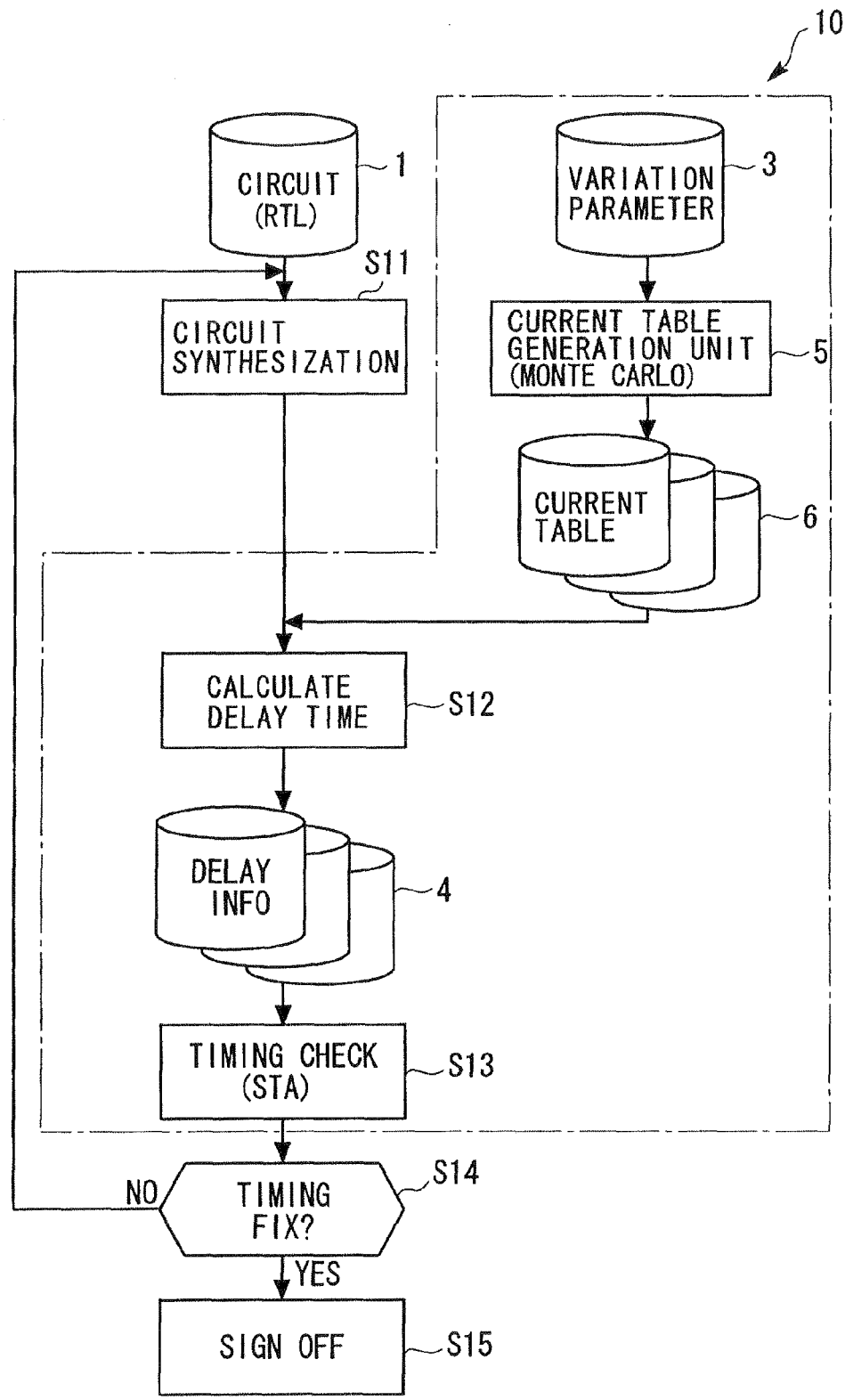
FIG. 7 is a diagram illustrating an outline of processing by the design supporting device in a first working example.

FIG. 7 is a diagram illustrating an outline of the processing of the design supporting device 10. The design supporting device 10 generates physical properties of the elements contained in the design target integrated circuit or the physical properties of the wires by Monte Carlo method within a predetermined variation range when executing the STA. The design supporting device 10 executes the STA of the integrated circuit including the elements or the wires having the physical properties by use of these physical properties of the elements or the wires that are generated within the predetermined variation range. A process in which the design supporting device 10 generates the physical properties based on the Monte Carlo method and executes the STA in the integrated circuit including the elements or the wires having the thus-generated physical properties, is called Monte Carlo STA (MSTA).

For example, the design supporting device 10 generates the delay time to cause the variations of the physical properties of a transistor at random by the Monte Carlo method with respect to the design data of the integrated circuit including a critical path indicating ill-convergence of the timing. Then, the design supporting device 10 performs, based on the generated delay time, a timing check of each of the paths within the integrated circuit.

For reflecting the physical properties of the transistor in the delay time of the transistor, the design supporting device 10 executes a current base delay calculation. In the current base delay calculation, the design supporting device 10 obtains, based on a model formula representing a current-voltage property of the transistor, a change in output current with respect to a change in input voltage of the transistor, and further obtains a change in output voltage corresponding to the change in output current. Then, the design supporting device 10 acquires the time till the output voltage change corresponding to the input voltage change occurs as the delay time of the transistor. The design supporting device 10 varies (disperses) at random the physical properties of the elements such as the transistors or the physical properties of the metal wires by the Monte Carlo method, and hence the delay time of the element or the metal wire gets varied corresponding to the variations of the physical properties. Accordingly, the design supporting device 10 enables the STA to be attained on the premise of the variations of the physical properties of the elements or the metal wires.

The design supporting device 10 calculates, e.g., the following model formula in order to calculate (the values in) the current table used for the current base delay calculation.

[Model Formula]

Iout=F (Carrier Mobility, Gate Oxide Film Thickness, Gate Width, Gate Length, Gate-to-Source Voltage, Threshold Value, Source-to-Drain Voltage), where the parameters such as the carrier mobility, the gate oxide film thickness, the gate width, the gate length, the gate-to-source voltage, the threshold value and the source-to-drain voltage are typical examples of the physical properties of the transistor. Hereinafter, the parameters, which include the physical properties of the transistor and affect the delay time of the circuit, will be called physical property information.

The model formula is described by a polynomial expression of the physical property information given in the above parentheses "( )". Further, the Monte Carlo method is applied to this model formula, and hence the design supporting device 10 generates a value of the physical property information, e.g., the gate length that is varied (dispersed) at random within the predetermined range. Herein, Iout is defined as, e.g., a drain current. The model formula involves, it is general, using a format that differs in a non-saturation region and in a saturation region.

As illustrated in FIG. 7, the design supporting device 10 retains, in the main storage device 12, for instance, circuit data 1 described by the RTL and variation parameter 3 which defines a range of the variations of the physical properties of the circuit elements contained in the design target integrated circuit. The "range of the variations" represents a range in which the values of the physical properties get fluctuated, and can be defined by, e.g., a coefficient D of which a maximum value is "1". The design supporting device 10 retains a default value of the coefficient D and may accept the coefficient D via the operation unit 15 from the user of the design supporting device 10.

The design supporting device 10, in the case of generating a random number R in a range of 0-1, can obtain a fluctuation value given by: "Fluctuation Value=Physical Property Fixed Value×(R−0.5)×D" with respect to the coefficient D. Furthermore, a value of the post-fluctuation physical property can be acquired by: "Post-Fluctuation Physical Property Value=Physical Property Fixed Value+Fluctuation Value=Physical Property Fixed Value×{1+(R−0.5)×D}. For example, in the case of setting D such as D=0.1, the value of the post-fluctuation physical property, it follows, becomes varied with respect to the fixed value of the physical property within a range of 0.95-fold through 1.05-fold, corresponding to the random number R. Herein, the fixed value of the physical property may involve using a design target value, an empirically experimentally acquired typical value, etc. Note that in addition to the physical properties of the element, a wire resistance, a wire capacitance and a gate capacitance of the posterior transistor may be fluctuated by use of the random number R.

As in FIG. 7, the design supporting device 10 executes, based on the circuit data 1 (RTL), the circuit synthesization (S11). As a result of the circuit synthesization, the gate-level netlist is generated based on the RTL. The gate-level netlist contains information for identifying the element such as the gate included in the circuit, the physical property information (fixed value of the physical property) of the element and the element-to-element connection information.

Moreover, the design supporting device 10 includes a current table generation unit 5. The CPU 11 of the design supporting device 10 executes the computer program deployed in the execution-enabled status on the main storage device 12 and functions as the current table generation unit 5 in accordance with the model formula, and thus generates a current table 6. Namely, the current table generation unit 5 generates the value varied at random within the predetermined range as the physical property information according to, e.g., the random number R and the coefficient D described above. Then, the current table generation unit 5 calculates, based on the model formula given above, the current value corresponding to the physical property information, and thus generates the current table 6. The current table provides time changes in drain current and in drain-to-source voltage with respect to a time change in input voltage, e.g., gate-to-source voltage according to the model formula. The current table generation unit 5 corresponds to a physical property value generation unit. Note that the design supporting device 10 may generate the physical property information of the metal wire in addition to the delay time of the transistor within the predetermined variation range.

Further, the design supporting device 10 calculates the delay time of the transistor from the time change in drain-to-source voltage (output voltage) corresponding to the time change in input voltage (gate-to-source voltage), and generates delay time information 4 (Delay Info) (S12). The CPU 11 of the design supporting device 10 executes, as an element delay calculation unit, the computer program deployed in the execution-enabled status on the main storage device 12, and executes a process in S12. Note that the design supporting device 10, through the process in S12, may incorporate the delay time based on the physical property information of the metal wire into the delay time information 4.

Then, the design supporting device 10 calculates, based on the gate-level netlist and the delay time information 4, the delay time of each of the paths within the design target integrated circuit. To be specific, the design supporting device 10 executes the STA on the basis of the delay time information 4 that is set with respect to each gate-level element (S13), and determines whether the delay time of each of the paths in the design target integrated circuit satisfies a given condition or not (S14). The CPU 11 of the design supporting device 10 executes, as a propagation time calculation unit, the computer program deployed in the execution-enabled status on the main storage device 12, and executes processes in S13 and S14.

According to the Monte Carlo method, as a result of the variation of the physical property information of the transistor, it follows that the delay time of each path comes into variations. Through the process such as this, the user makes a variety of judgments from the variations of the delay time of the path. For example, the user sets a variety of given conditions. The condition in S14 may be set such that a determination value of the delay time for which to become, e.g., a setup error or a hold error is distanced 3 or larger sigma (σ) from the mean delay time of the path. Herein, sigma represents a standard deviation. Then, if the delay time of the path indicates a normal distribution, it is feasible to set such a check value as not to become the setup error or the hold error at a possibility of 99.7%.

If there exists the path where the delay time does not satisfy the given condition, the design supporting device 10 loops the processing back to S11, then changes the setting condition and again executes the circuit synthesization. The setting condition connotes the setting of the cost function for the circuit synthesization and the setting of an upper limit of the gate count and of an upper limit of the gate size. Whereas if the delay time of each of the paths within the design target integrated circuit satisfies the given condition, the design is ended (S15).

Figure 8:
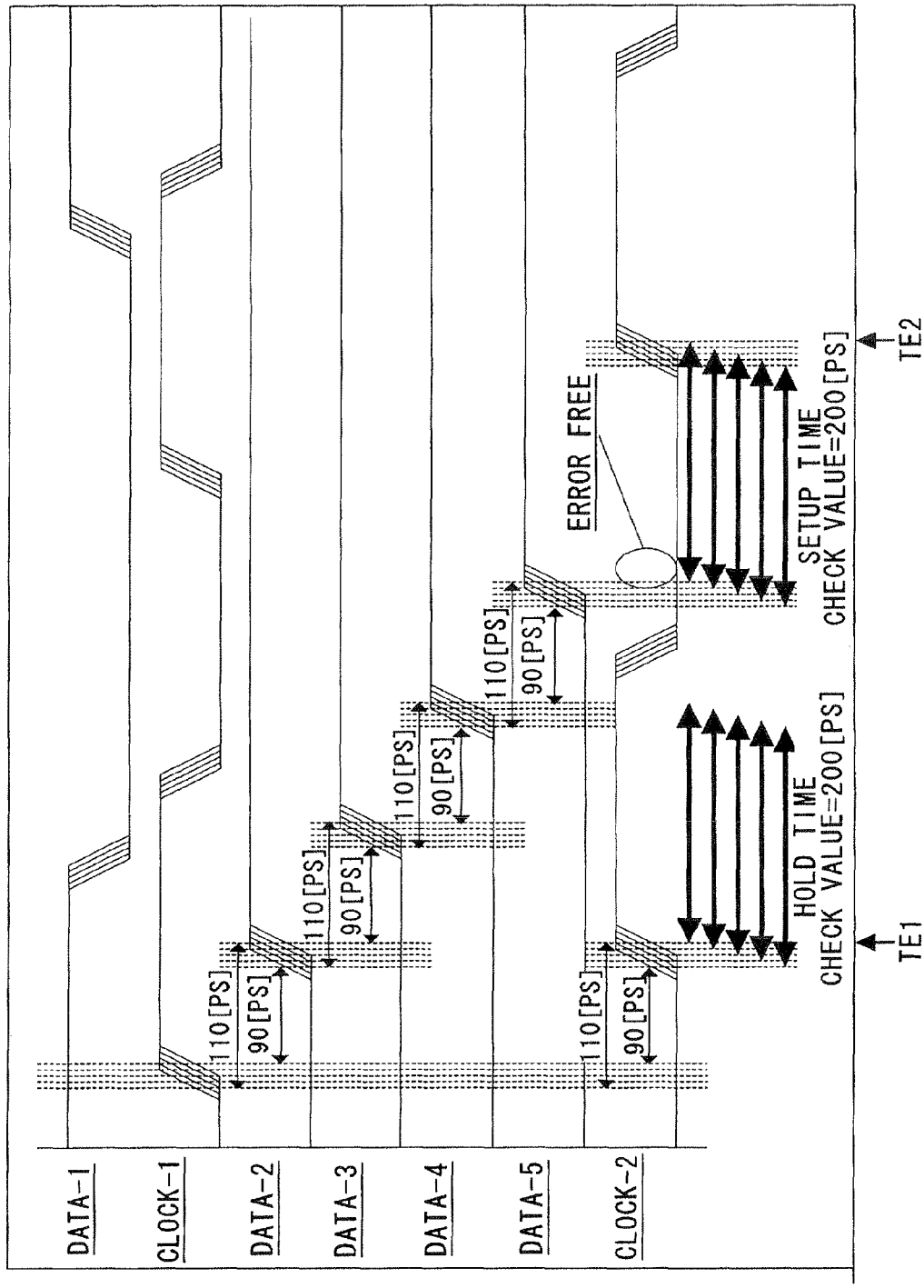
FIG. 8 is a timing chart illustrating a result of executing the timing analysis in the first working example.

FIG. 8 is a timing chart illustrating a result of executing the timing analysis by the design supporting device 10 depicted in FIG. 7 with respect to the same integrated circuit as in the comparative example of FIG. 4. As in FIG. 8, the result will be that the variations occur, corresponding to the variations of the physical properties of the elements within the integrated circuit, at the rising edge TE10 of the clock Clock-1, the rising edge TE20 of the clock Clock-2, the input signal Data-2, 3, 4 to the gates G1-G3 and further the input timing of the input signals to the flip-flops FF1, FF2. For example, the delay time of the gates G1-G3 fluctuates in a range of 90 ps through 110 ps.

Figure 9:
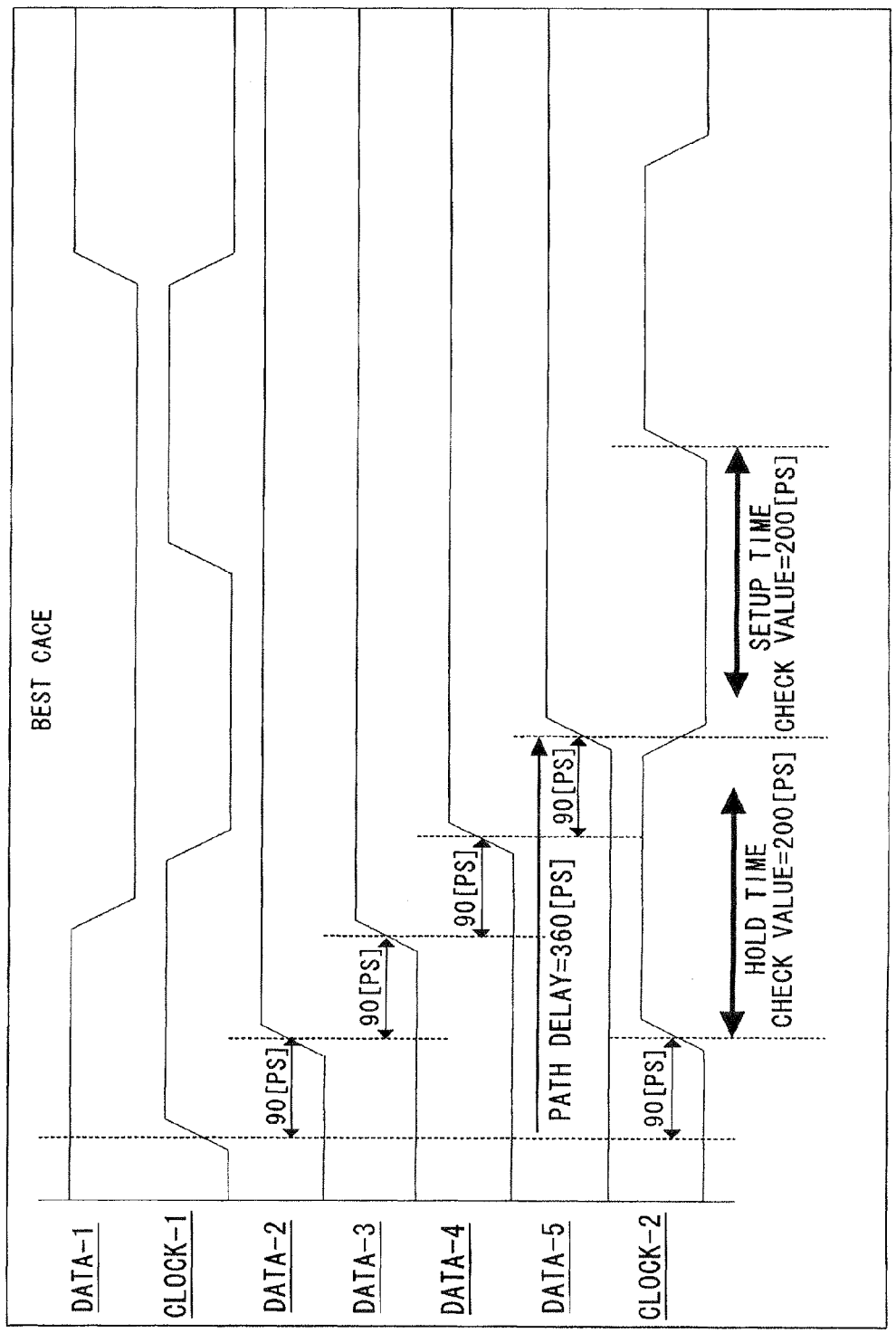
FIG. 9 is an example of a timing chart in a best case.

FIG. 9 illustrates a case of extracting a combination of waveforms from the timing chart in FIG. 8 when a maximum timing allowance is given. The timing in FIG. 9 is to be called a best case. FIG. 9 illustrates a case of extracting the waveform of the delay time, in which the delay time of the gates G1-G3 is 90 ps. In this case, the setup error does not occur at the rising edge TE20 of Clock-2.

Figure 10:
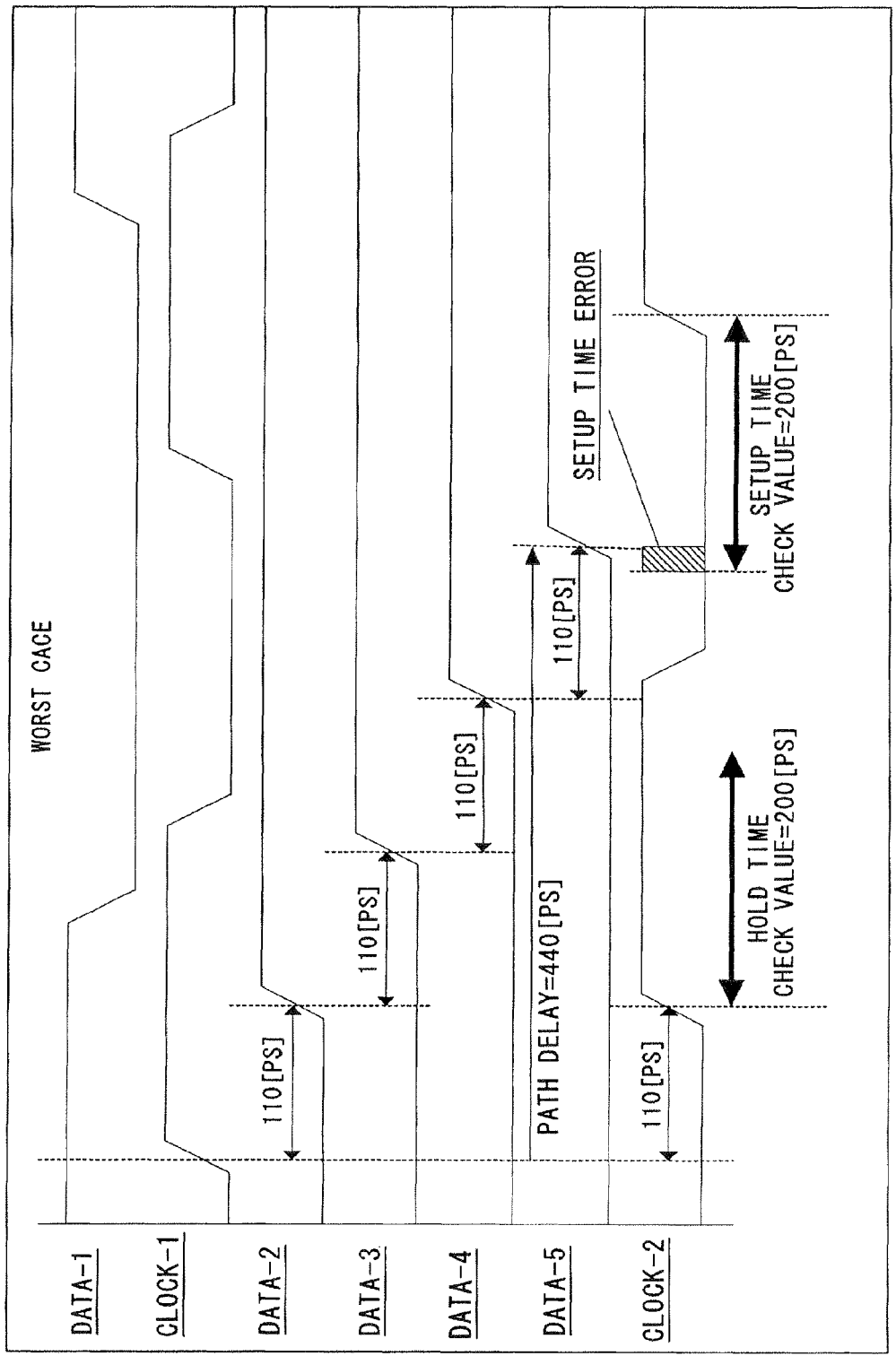
FIG. 10 is an example of a timing chart in a worst case.

FIG. 10 illustrates a case of extracting the combination of waveforms from the timing chart in FIG. 8 when a minimum timing allowance is given. The timing in FIG. 10 is to be called a worst case. FIG. 10 illustrates a case of extracting the waveform of the delay time, in which the delay time of the gates G1-G3 is 110 ps. In this case, the setup error occurs at the rising edge TE20 of Clock-2. Thus, according to the design supporting device 10, it is feasible to execute the calculation of the delay time and the timing analysis corresponding to the variations of the physical property of the transistor contained in the design target integrated circuit.

As discussed above, the design supporting device 10 according to the first working example causes the variations of the physical property of the element, e.g., the gate length etc of the transistor at random within the predetermined range. Then, the design supporting device 10 calculates the output current (drain current) and the output voltage (drain-to-source voltage) with respect to the input voltage (e.g., the gate-to-source voltage) when the gate length changes. The calculation of drain current in this case may involve using the simple model formula such as the polynomial expression. Then, the design supporting device 10 calculates the delay time of the transistor from the change in output voltage, which corresponds to the change in input voltage.

This process enables acquisitions of the change in output current and the change in output voltage with respect to the change in input voltage by the simple model formula containing the physical property of the transistor and the input voltage. Accordingly, as compared with a technology of simulating the circuit operation by solving a differential equation, e.g., SPICE (Simulation Program with Integrated Circuit Emphasis) simulation, with an extremely small amount of calculations, it is possible to calculate the delay time of the path within the integrated circuit in the case of changing at random the physical property of the integrated circuit containing the physical property of the transistor. Therefore, for instance, in place of adopting the technique of relaxing the excessive margin in the statistical process given in the comparative example, it is feasible to grasp the delay time and analyze the timing of the signal propagated to each of the elements within the integrated circuit on the premise that the property of the transistor gets varied within a predetermined range or a user's designation range.

SECOND WORKING EXAMPLE

The design supporting device 10 according to a second working example will be described with reference to the drawings of FIGS. 11 through 33. The first working example has discussed the process of calculating the delay time of the transistor in the case of changing at random the physical property of the transistor within the integrated circuit and executing the timing analysis of the integrated circuit. The second working example will more specifically discuss the processing example in the case of changing at random the physical property of the transistor. The configuration and the operation in the second working example are basically the same as in the first working example. Such being the case, an in-depth description of a configuration different from the first working example will be made.

<First Example of Calculation of Delay Time>

Figure 11:
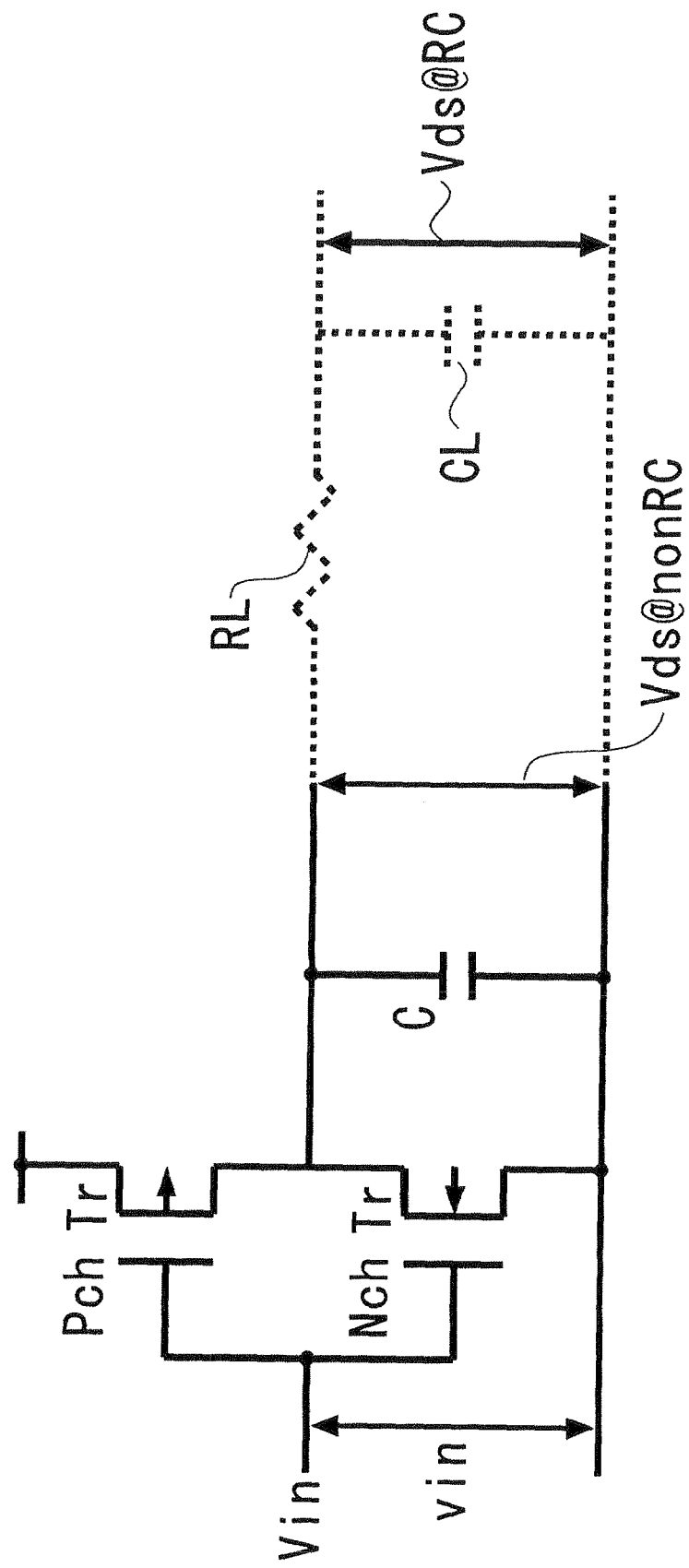
FIG. 11 is a diagram illustrating an example of an inverter circuit to which MSTA is applied in a second working example.

To start with, a process of the MSTA will be explained by taking an example of a circuit including one inverter. FIG. 11 illustrates the example of the inverter circuit. FIG. 11 illustrates a CMOS (Complementary Metal Oxide Semiconductor) inverter including a P-type transistor (Pch Tr) and an N-type transistor (Nch Tr). Further, "C" denotes a capacitance of the output circuit of the CMOS inverter in FIG. 11. Herein, the capacitance C of the output circuit is defined as a capacitance connecting to each of drains of the P-type transistor and the N-type transistor, e.g., a diffusion parasitic capacitance. In the following calculation, however, the delay time is calculated by taking account of, in addition to the diffusion parasitic capacitance of the CMOS inverter, further a total sum of the capacitances of the wires and via contacts. Then, dashed lines in FIG. 11 depict a load resistance RL and a load capacitance CL which become the load of the CMOS inverter.

The load resistance RL can be exemplified as a resistance of the metal wire or the via contact connected to the CMOS inverter. Moreover, the load capacitance CL can be exemplified by a capacitance including a capacitance of the metal wire, a capacitance of the via contact or a gate capacitance of the posterior transistor. What will hereinafter be considered is a case in which an input voltage Vin is inputted to and an output voltage Vds is output to the CMOS inverter in FIG. 11. Further, Vds@nonRC is assumed to be an output voltage (drain-to-source voltage) in the case of not taking the load resistance RL and the load capacitance CL into consideration in FIG. 11. Moreover, Vds@RC is assumed to be an output voltage in the case of taking the load resistance RL and the load capacitance CL into consideration.

Considered at first is an operation of the CMOS inverter in such a case that an input pulse is an ideal pulse having no rounding of the waveform for conjecture in a way that simplifies the circuit operation. The CMOS inverter is normally provided with a complete set of drain currents of the P-type transistor and the N-type transistor. Such being the case, a presumption is that the P-type transistor and the N-type transistor in FIG. 11 have a characteristic of showing symmetry. Accordingly, in the following analysis, an examination about transitions to the saturation region and to the non-saturation region will be made, however, there is no particular distinction between the P-type transistor and the N-type transistor.

Figure 12:
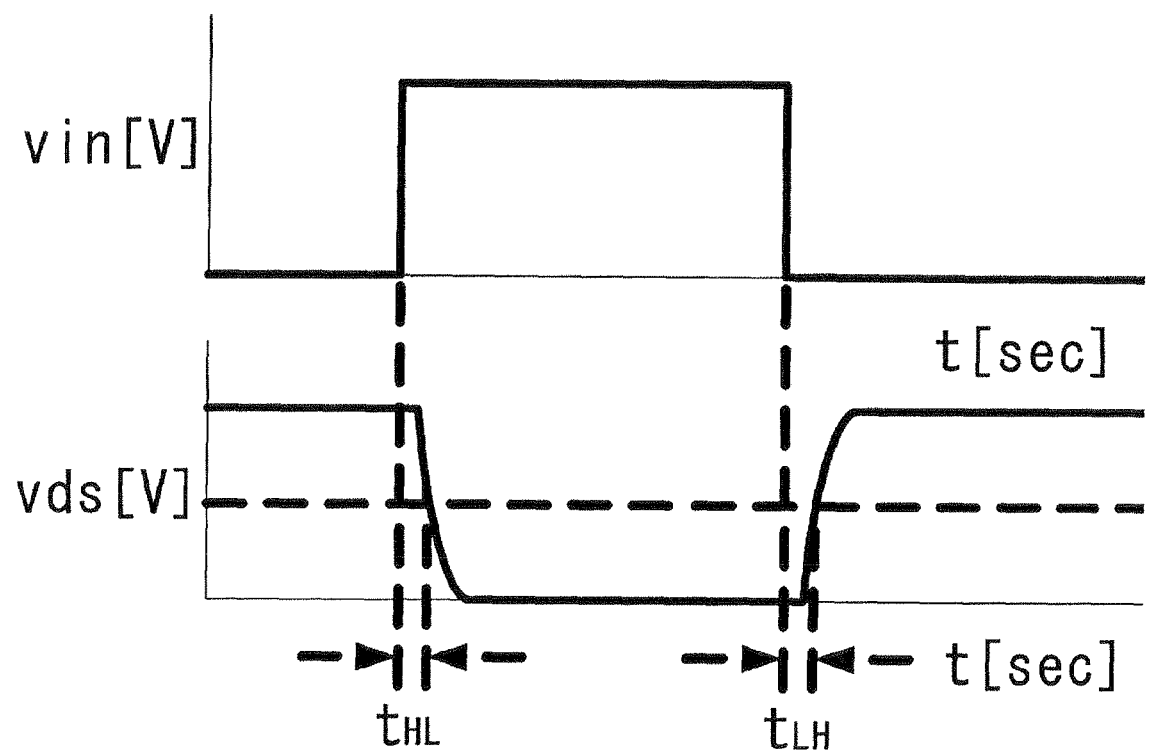
FIG. 12 is a diagram illustrating an example of a waveform of a circuit.

FIG. 12 illustrates an example of the waveform of the circuit in FIG. 11. As in FIG. 12, even when the input pulse is presumed to be the ideal pulse, the output pulse takes a rounded shape (different) from an ideal rectangular shape, depending on the operation characteristic of the CMOS inverter. Rising delay time is expressed by tLH, and falling delay time is expressed by tHL. Any inconvenience may not be caused by considering only the delay time tHL because of having the symmetry. Namely, the delay time in the case where Vin changes from LO to HI is to be analyzed.

Figure 13:
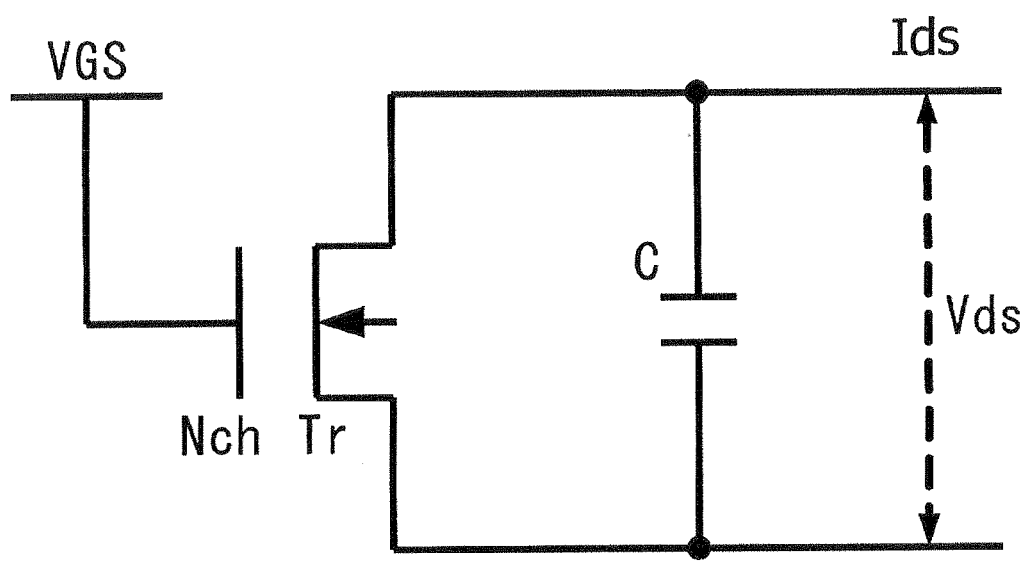
FIG. 13 is a diagram illustrating an example of an equivalent circuit of the inverter circuit.
Figure 14:
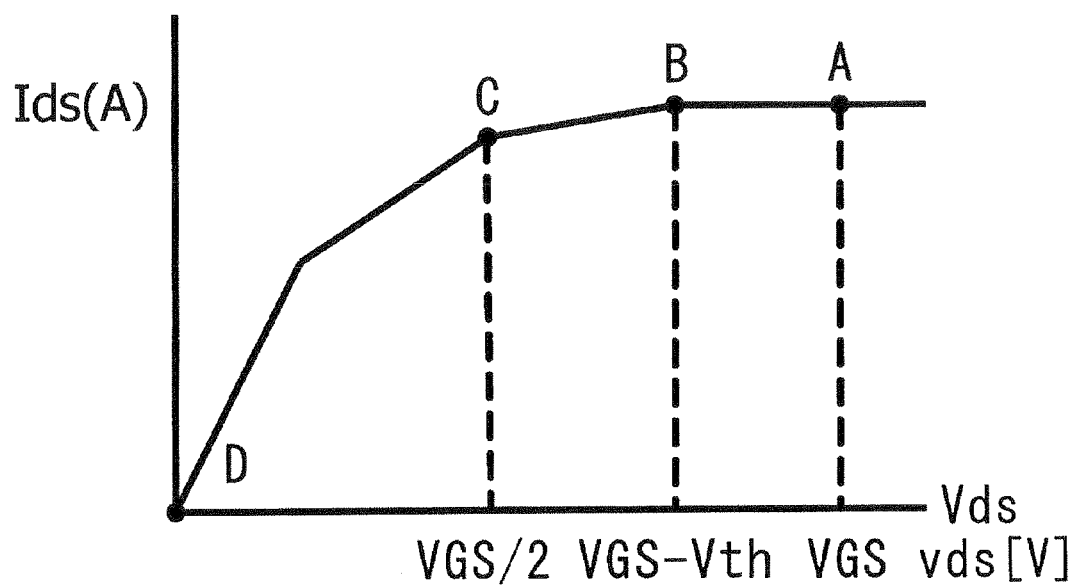
FIG. 14 is a diagram illustrating a current-voltage characteristic.

Now, supposing that the input voltage Vin rises when t=0, it follows that Vin=0 [v] and Vds=Source Voltage VDD before when t=0. Further, another presumption is that if the input rises when t=0, the P-type transistor immediately gets cut-off. Then, the circuit in FIG. 11 can be expressed by an equivalent circuit in FIG. 13, FIG. 14 illustrates a current-voltage (Ids-Vds) characteristic. Herein, Ids represents the drain current, and Vds stands for a drain-to-source voltage.

An operation point at t=0 exists at a point A in FIG. 14. Namely, the point A implies a case where the source-to-drain voltage is coincident with the gate-to-source voltage (Vds=Vgs). Thereafter, as the time elapses, the operation point moves toward a point D from the point A in FIG. 14. The delay time of tHL can be obtained by tracking a curve in FIG. 14.

The saturation region of the transistor extends from the point A to the point B in FIG. 14. In the saturation region, the transistor can be treated as a constant current source. The drain current Ids in the saturation region can be described in the model formula given in a mathematical expression 1.

$$I_{DS}=(1/2)\mu_0 C_{ox}(W/L)((V_{GS}-V_{th})^2 \quad \text{[Mathematical Expression 1]}$$

Where $\mu_0$ is a mobility of a carrier in the semiconductor substrate, Cox is a gate capacitance per unit square measure, W is a gate width, L is a gate length, and Vth is a threshold value of the transistor. From the mathematical expression 1, let tAB be time required for the operation point to move from the point A to the point B in FIG. 14, the time tAB can be obtained by a mathematical expression 2. In the mathematical expression 2, however, C represents the capacitance C of the output circuit in FIGS. 11 and 13. In the mathematical expression 2, the time required for the drain-to-source voltage Vds to change from Vgs to Vgs-Vth is obtained from charging time of the source-to-drain current.

$$t_{AB} = \frac{CV_{GS}-C(V_{GS}-V_{th})}{I_{DS}} \quad \text{[Mathematical Expression 2]}$$
$$= \frac{CV_{th}}{\frac{1}{2}\mu_0 C_{ox}\left(\frac{W}{L}\right)(V_{GS}-V_{th})^2}$$

Next, the time tBC expended for the operation point to move from the point B to the point C in FIG. 14 can be acquired as follows. The time tBC exists in the non-saturation region, and therefore the drain current Ids is given by the mathematical expression 3.

$$I_{DS}=\mu_0 C_{ox}(W/L)((V_{GS}-V_{th})V_{DS}-(1/2)V_{DS}^2) \quad \text{[Mathematical Expression 3]}$$

This drain current Ids depends on the output voltage Vds. Herein, a time integral of the current is defined as a charge quantity, and hence a relation of the mathematical expression 4 is established. Herein, dt is a time variation, and dVds is a variation of the output voltage.

$$Ids\, dt = -C\, dVds \quad \text{[Mathematical Expression 4]}$$

Further, the mathematical expression 5 is obtained by substituting Ids of the mathematical expression 3 into the mathematical expression 4 and shifting a factor including the output voltage Vds to the right side.

[Mathematical Expression 5]

$$\frac{\mu_0 C_{ox}\left(\frac{W}{L}\right)}{2C} dt = \frac{1}{2(V_{GS}-V_{th})} \cdot \frac{dv_{DS}}{\frac{v_{DS}^2}{2(V_{GS}-V_{th})}-v_{DS}}$$

The left side of the mathematical expression 5 is integrated from the time 0 to the time tBC, and the right side is integrating from VGS-Vth to ½Vgs, and arrangement with respect to tBC is made, thereby obtaining the mathematical expression 6.

[Mathematical Expression 6]

$$t_{BC} = \frac{C}{\mu_0 C_{ox}\left(\frac{W}{L}\right)(V_{GS}-V_{th})} \ln\left(\frac{3V_{GS}-4V_{th}}{V_{GS}}\right)$$

Then, time tAC of transition from the operation point A to the operation point C in the rising delay time can be obtained by the mathematical expression 7.

$$tAC = tAB + tBC \quad \text{[Mathematical Expression 7]}$$

An example of calculating the delay time of the circuit in FIG. 11 or 13 will be explained by employing the formulae given above. Now, supposing that VDD=1.8 v, the output voltage Vds is changed in, e.g., 0.1 increments from 1.8 v down to 0 v. At this time, the output current corresponding to each output voltage Vds can be acquired in the saturation region by the mathematical expression 1 and in the non-saturation region by the mathematical expression 3.

Now, the drain-to-source voltage Vds is changed in, e.g., 0.1 increments from 1.8 v down to 0 v, and a change in drain current Ids is calculated according to the mathematical expressions 1 through 7. For example, when establishing Vgs=1.8 on the assumption of the threshold value Vth=0.36 v as the characteristic of the transistor, the voltage Vds is given by: Vds=1.8−0.36=1.44 at the point B in FIG. 14. Further, the point C is such an operation point that Vds is given by: Vgs/2=0.9 v.

Then, the output current Ids may be calculated by use of the mathematical expression 1 for the saturation region when Vds ranges from 1.8 v to 1.5 v and the mathematical expression 3 for the non-saturation region when Vds is equal to or smaller than 1.4. Moreover, the time tAB in the saturation region is obtained by the mathematical expression 2, and the time tBC in the non-saturation region is obtained by the mathematical expression 6. For instance, tAB is given by: tAB=3.28 ps, and tBC is given by: tBC=5.17 ps.

Furthermore, for example, 1 ps is set as a resolution of the time-base. Then, the time values can be rounded such as tAB=3 ps and tBC=5 ps. Thus, e.g., it can be considered that the saturation region covers a range of 1.8 v through 1.5 v in Vds and that the non-saturation region covers a range of being smaller than 1.5 v in Vds.

Then, a relation between Vds and Ids is mapped to the time variation in unit time (1 ps) increments. In this case, the saturation region is defined by tAB=3 ps, while the time range from 4 ps onward is the non-saturation region. Then, the Vds-change from 1.8 v to 1.5 v is set to the change from 0 sec to 3 ps on the time-base. Further, in the non-saturation region, the time when changing from the operation point B to the operation point C in FIG. 14 is given by: tBC=5 ps. Now, it is assumed that change from 1.5 v to 0.9 v in Vds is set to the change from 3 ps to 0ps on the time-base. Moreover, the Vds-change of being equal to smaller than 0.8 v can be calculated in the same way as the above-mentioned, in which the time from the operation point C to the operation point D in FIG. 14 is expressed by tCD. Namely, it is sufficient that the left side of the mathematical expression 5 is integrated from the time 0 to tCD, and that the right side is integrated from ½Vgs=0.9 v down to 0. An interval extending from the point C to the origin D in FIG. 14 may, however, be calculated by a single calculating operation, or alternatively the transition of the operation point may be calculated in a manner that segments the interval into a plurality of sub-intervals.

Figure 16:
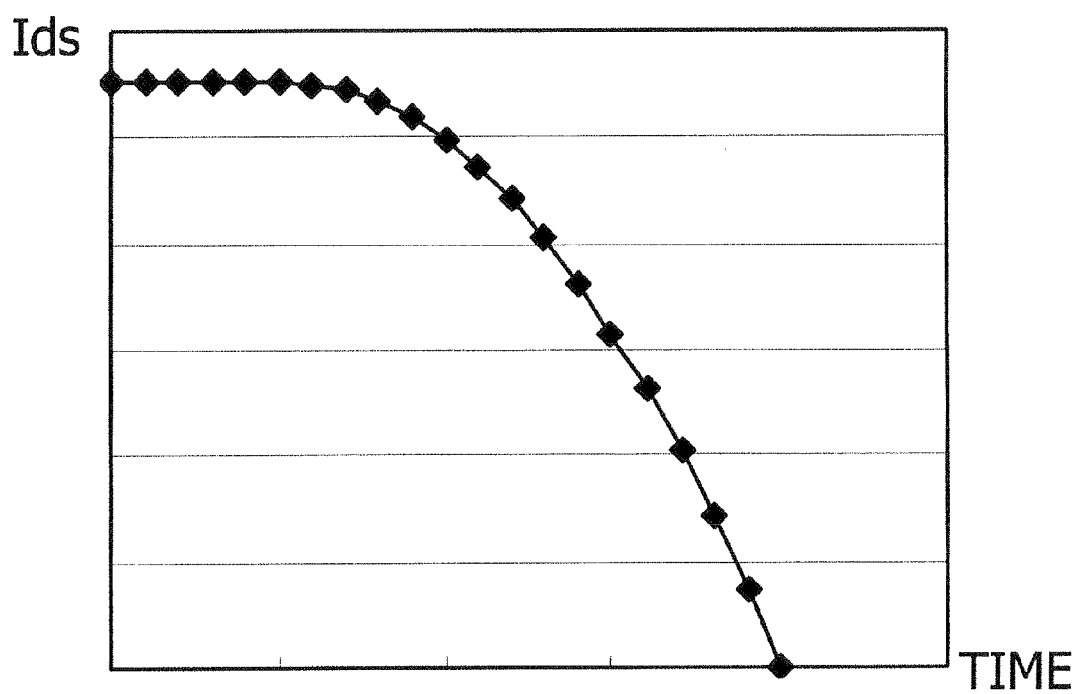
FIG. 16 is a diagram of plotting time-based changes of a drain current.

Through the procedures described above, the design supporting device 10 generates the current table on the main storage device 12. FIG. 15 illustrates a structure of the current table. Each line in the table illustrated in FIG. 15 indicates one record of the current table. In FIG. 15, the first line provides an item description. As in FIG. 15, the record of the current table contains items such as the time period (also simply termed the time), the input voltage, the output current and the output voltage. Accordingly, the record of the current table is generated for the time in unit time (1 ps) increments. When the change in Vds in the current table generated through the procedures described above is mapped to the time-base, a relation between the time-base and Ids can be plotted as in FIG. 16. FIG. 16 is a graph of plotting the calculation results described above, in which the axis of abscissa represents the time, and the axis of ordinates represents the current Ids.

Calculated further is the delay time of the transistor when the rectangular wave having the predetermined rising time (Tr) and the falling time (Tf) is inputted as the input signal. In the transistor, a current drive capability of the transistor changes corresponding to a level of the input signal, and therefore the delay time of the transistor also changes. Accordingly, the delay time of the transistor can be considered separately in the following three categories.

(1) The delay time till the transistor reaches a state of having the sufficient current drive capability, which accompanies the change in level of the input signal.

(2) The delay time based on the intra-element capacitance C such as the drain-to-gate capacitance of the transistor.

(3) The delay time based on the resistance and the capacitance of the metal wire portion connected to the output of the transistor.

In these categories of delay time, a degree in which the rising time and the falling time of the input pulse to the transistor affect the variation of the delay time is small as compared with, e.g., the variation of the manufacture etc. Such being the case, the second working example deals with the delay time of the transistor, which depends on the rising time and the falling time of the input signal, simply as a fixed value. An assumption herein is that the input voltage Vin is defined as a ramp input. Then, for instance, a condition for determining the rising time tf is that the time till the input voltage Vin reaches HI (e.g., 1.8 v) from LO (e.g., 0 v) is assumed to be, e.g., 100 ps. The condition for the rising time or the falling time of the input voltage such as this is referred to as an input slew. Then, the presumption in the second working example is that the delay time accompanying the change in current drive capability of the transistor, which depends on the rising time of the input voltage such as this, is the fixed value (e.g., 20 ps). The fixed value may involve using the experimental value, the empirical value, the value acquired from the simulation, etc.

Further, after an elapse of the rising time of the input voltage, for instance, the P-type transistor is cut off, while the N-type transistor reaches the saturation state. Further, the hypothesis in the second working example is that the P-type transistor and the N-type transistor in FIG. 11 are characteristic of having the symmetry, so that the change in transistor characteristic given when the P-type transistor transitions to the non-saturation state from the saturation state is symmetrical with respect to the change in characteristic given when the N-type transistor changes (transitions) to the saturation state from the non-saturation state. Accordingly, the second working example will, without touching upon the types of the transistors, examine the delay time in a case where the transistor simply reaches the non-saturation state from the saturation state.

Thereupon, a period of delay time, i.e., a period of Ids not changing for, e.g., 20 ps, which accompanies the rising time of the input voltage, is added anterior to the first record (the record specified by the "time 0" ("0" given in the item "time") in the current table of FIG. 15 or anterior to the time change of Ids in FIG. 16.

Moreover, as for the metal wire portion (indicated by a dotted line) illustrated in FIG. 11, for example, supposing that the resistance RL=50Ω and the capacitance CL=0.1 pF, the delay time tau of the metal wire portion can be calculated such as: tau=5 ps.

Figure 17:
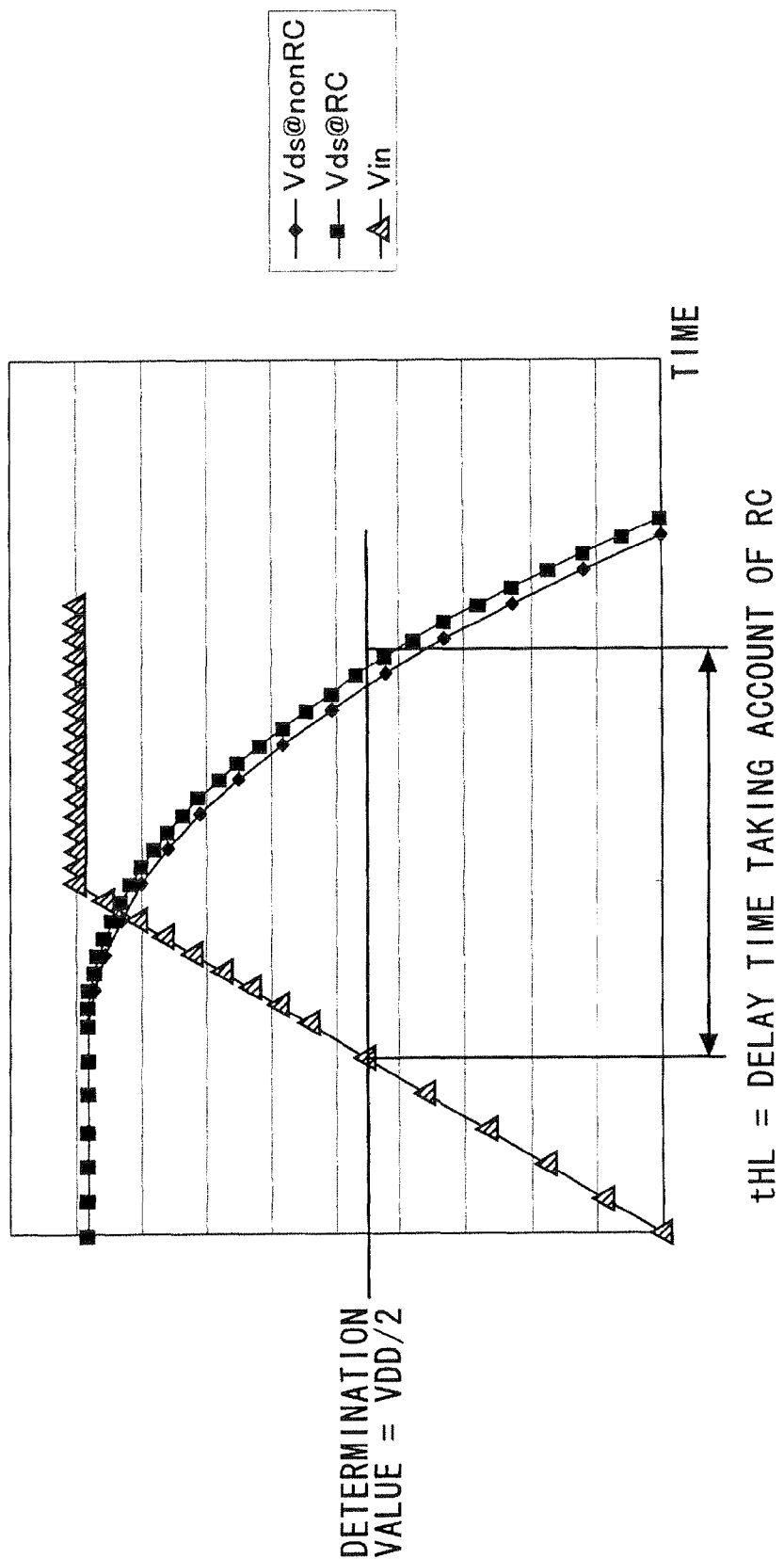
FIG. 17 is a diagram of plotting changes of output voltage with respect to input voltage.

FIG. 17 is a graph generated by plotting the changes in Vds@nonRC and Vds@RC of the CMOS circuit in FIG. 11 with respect to the input voltage Vin. Vds@nonRC and Vds@RC correspond to the voltages in the positions illustrated in the circuit diagram of FIG. 11. In FIG. 17, the axis of abscissa represents the time, and the axis of ordinates represents the voltage, respectively. Moreover, a mark of triangle indicates the input voltage Vin, a mark of rhomboid indicates Vds@nonRC, and a mark of rectangle indicates Vds@RC.

Furthermore, in FIG. 17, for instance, a voltage Vin, which is given by: Vin=Vds@nonRC=Vds@RC=VDD/2=0.9 v, is set as a determination voltage for determining the delay time. Note that the determination voltage corresponds to a signal level. Then, the delay time of the CMOS portion can be calculated from the time ranging from a point at which the line given by the voltage=0.9 v along the axis of ordinates intersects Vin to a point at which the line given by the voltage=0.9 v along the axis of ordinates intersects Vds@nonRC. Further, the delay time of the circuit including the CMOS portion and the metal wire can be calculated from the time ranging from the point at which the line given by the voltage=0.9 v along the axis of ordinates intersects Vin to a point at which the line given by the voltage=0.9 v along the axis of ordinates intersects Vds@RC.

Moreover, it is presumed that the physical property information of the integrated circuit, such as the mobility $\mu 0$ of the carrier in the semiconductor substrate, the gate capacitance Cox (further, a dielectric constant and a film thickness of the oxide film) per unit square measure, the gate width W, the gate length L, the threshold voltage Vth of the transistor, the transistor capacitance C including the drain-to-gate capacitance of the transistor and the resistance RL and the capacitance CL of the metal wire, changes at random within the predetermined range due to the manufacturing variations etc. Hereupon, as obvious from the mathematical expressions 1 and 3, the value of Ids fluctuates, and hence as apparent from the mathematical expressions 2 and 4, tAB, LBC and tCD also change. Accordingly, the physical property information of the integrated circuit is changed at random, thereby making it feasible to obtain the variation of the delay time of the integrated circuit, which takes account of the manufacturing variation. Note that the predetermined range for changing the physical property information at random may be determined experimentally and empirically. This range may also be changed based on a user's designation of a default value determined experimentally and empirically.

<Second Example of Calculation of Delay Time>

Figure 18:
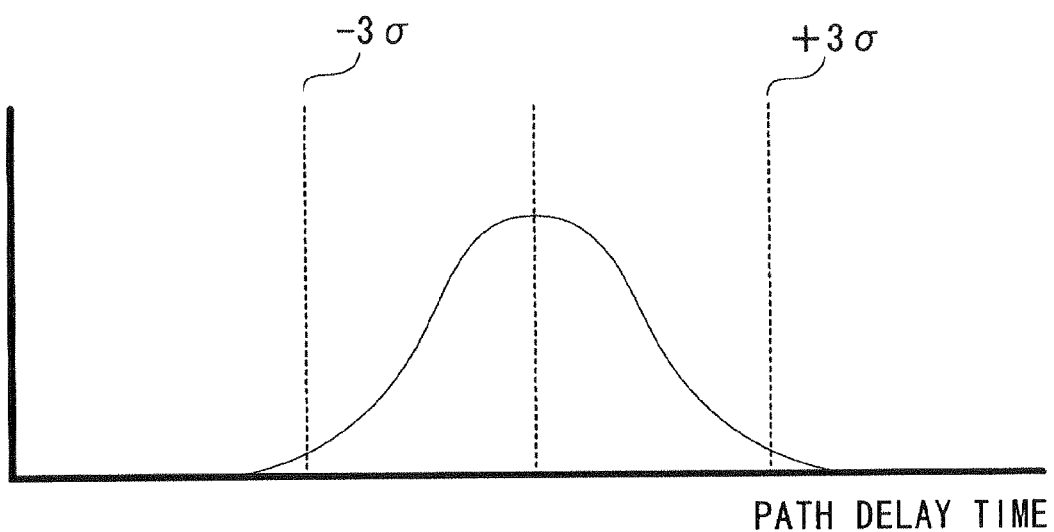
FIG. 18 is a diagram illustrating an example of delay time distribution approximate to a normal distribution.

FIGS. 18-21 illustrated examples in which the calculated path delay time is expressed in histogram. FIG. 18 illustrates an example of a delay time distribution that is substantially approximate to a normal distribution. In FIG. 18, the axis of abscissa represents the delay time of the path, and the axis of the ordinates represents a distribution count. Further, for instance, in FIG. 18, positions of two vertical lines indicated by 3σ are 3-fold (3 sigma) positions of the standard deviation. Accordingly, for example, the check value is set in the position on a more external side (more peripheral side) than the position indicated by 3σ in FIG. 24 as a check value of the path delay time when executing the STA, thereby enabling an errorless check value to be selected with a probability of 3σ range (99.7% of the distribution) of the distribution. Namely, the STA check value can be selected from the path delay time distribution acquired as a result of the MSTA so that the error probability becomes a desired value of the user.

Figure 19:
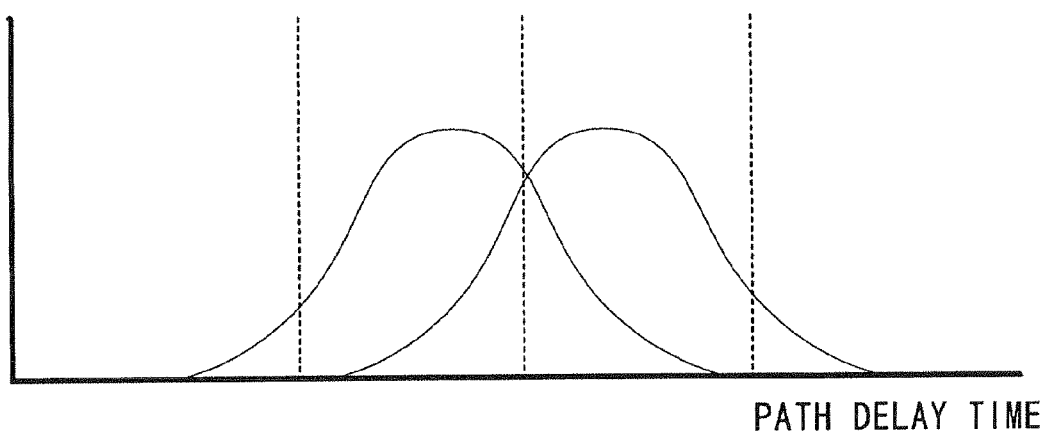
FIG. 19 is diagram illustrating an example in which the delay time distribution consists of a combination of two normal distributions.

FIG. 19 illustrates an example in which the delay time distribution is a combination of the two normal distributions. For example, if different types of transistors and buffers exist on the delay time calculation target path, it follows that the delay time distribution is organized by a combination of the plurality of normal distributions. The different type of transistor connotes, e.g., the transistor having different physical property information such as the gate length L.

Figure 20:
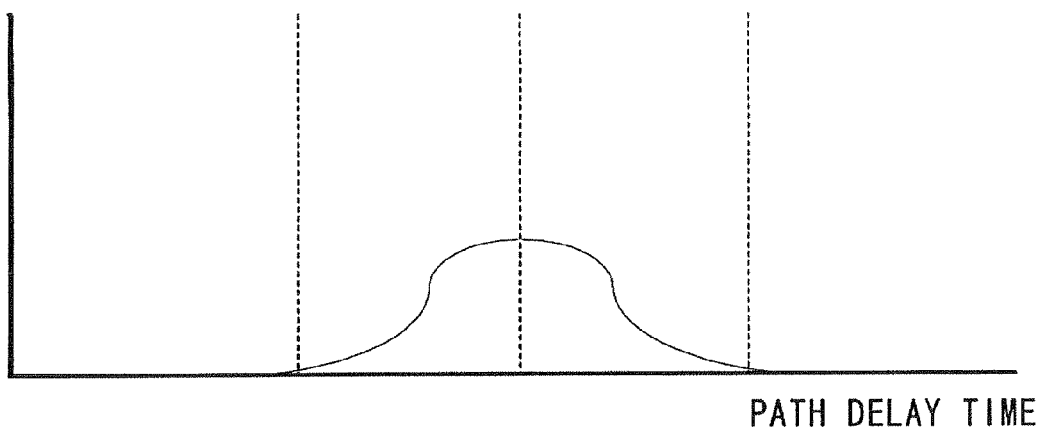
FIG. 20 is a diagram illustrating an example of the delay time distribution in the case of a small trial count.

FIG. 20 illustrates an example of the delay time distribution in a case where the trial count, i.e., a Monte Carlo sample count is small. The design supporting device 10 in the second working example can grasp the tendency of the delay time distribution even when the sample count is small.

Figure 21:
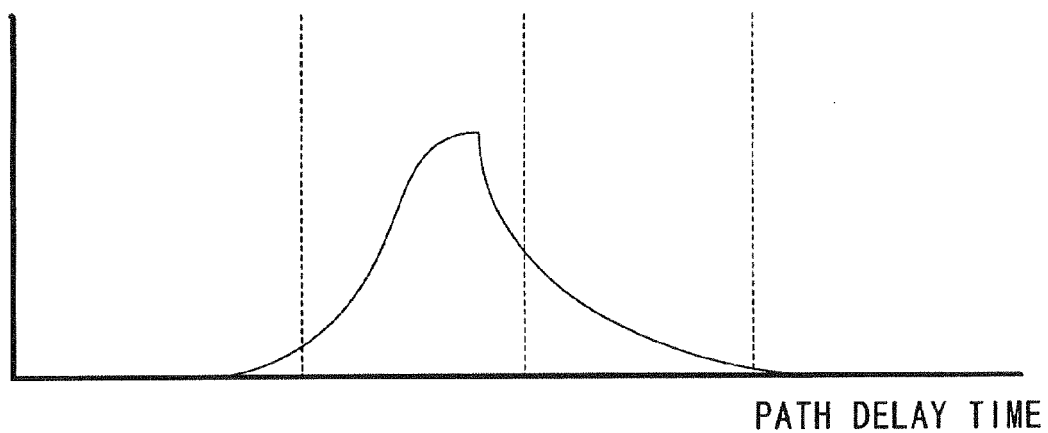
FIG. 21 is a diagram illustrating an example of a cell delay time distribution in such a case that a P-type transistor and an N-type transistor are characteristics of being asymmetrical.

FIG. 21 illustrates an example of the delay time distribution in a case where the P-type transistor and the N-type transistor have cells exhibiting different characteristics. In the example of FIG. 21, a peak position exists in a location deviating from the design target delay time 400 ps.

<Processing Flow>

Figure 22A:
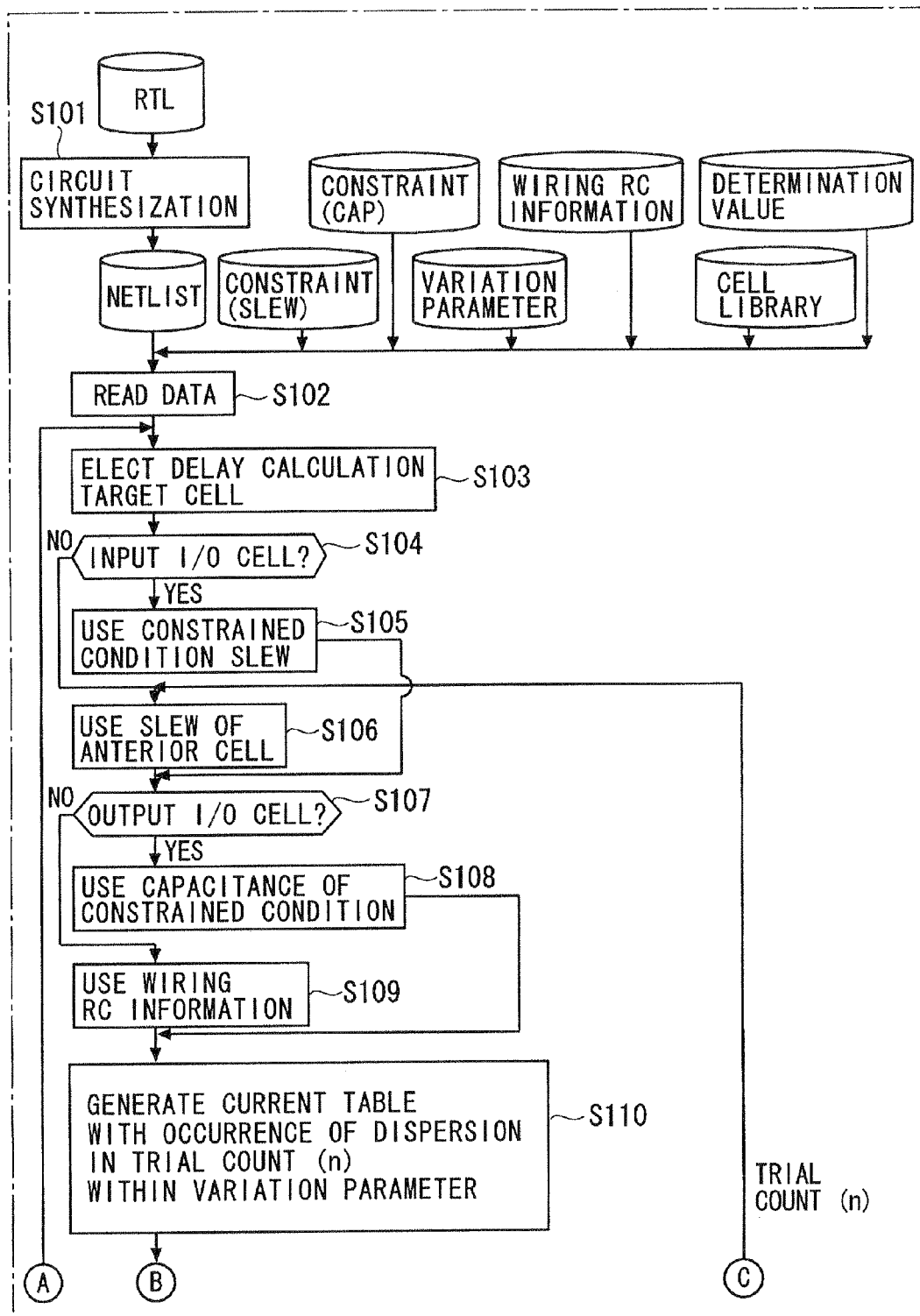
FIG. 22A is a flowchart illustrating processes of the design supporting device according to the second working example.
Figure 22B:
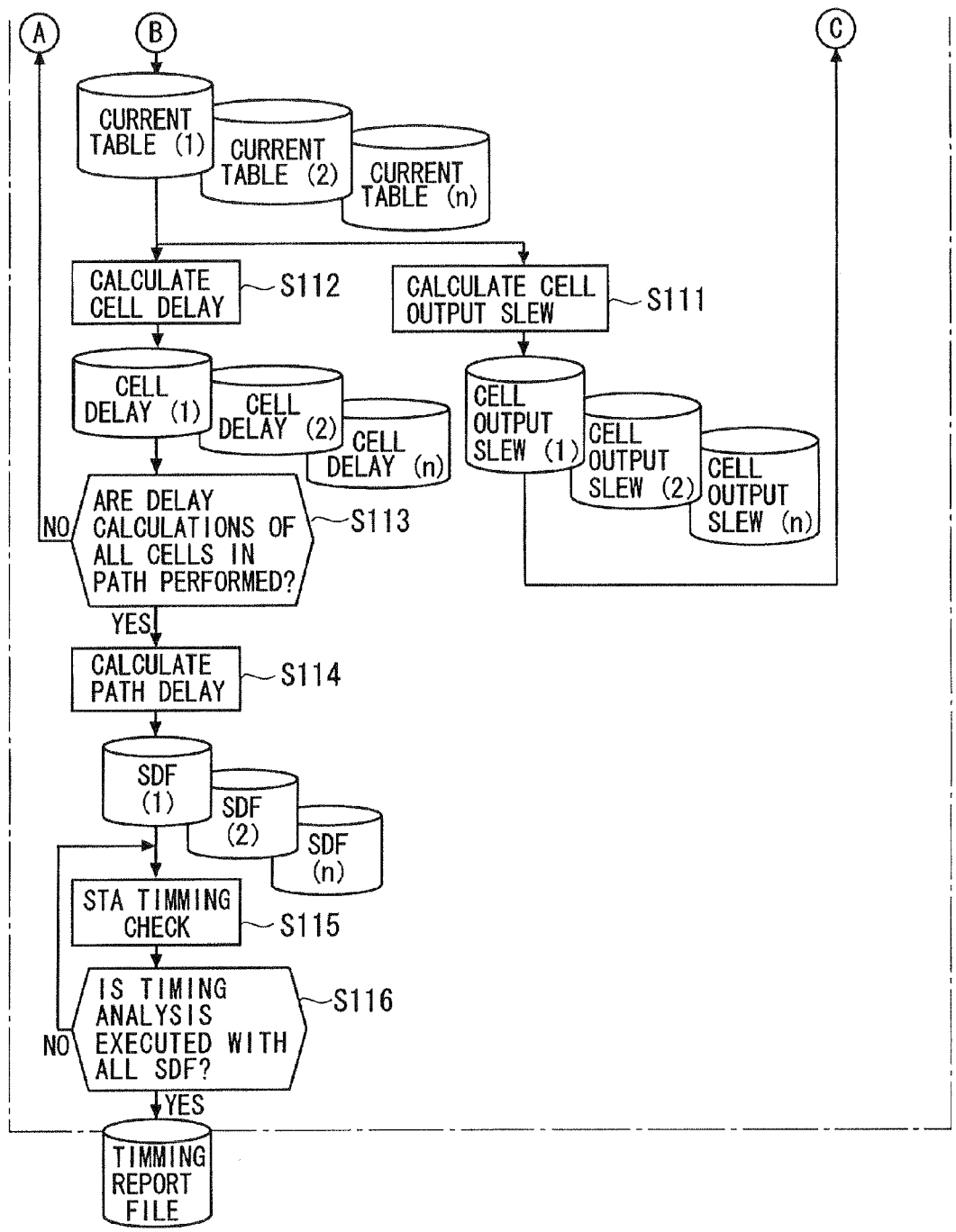
FIG. 22B is a flowchart illustrating the processes of the design supporting device according to the second working example.

FIGS. 22A and 22B illustrate examples of processing flowcharts of the design supporting device 10 according to the second working example. The CPU 11 of the design supporting device 10 executes the computer program deployed in the execution-enabled status on the main storage device 12, thereby providing processes in FIGS. 22A and 22B. Note that FIG. 22A continues to FIG. 22B via symbols (flow points) A, B and C.

The design supporting device 10 receives an input of RTL (Register Transfer Level) design data and executes the circuit synthesization (S101). The described-by-RTL design data of the hardware circuit is converted into the gate-level netlist by use of a tool for providing a function called logical synthesization. Incidentally, though not illustrated, layout data is temporarily generated from the netlist. Then, the wiring RC information etc is determined from the layout data.

The design supporting device 10 in the second working example reads, from a database of the external storage device 13 onto the main storage device 12, in addition to the synthesized netlist, the rinsing and falling constrained conditions (slew) of the input signal inputted to the design target integrated circuit, the constrained conditions (Cap) of the capacitances including input impedances of the metal wire on the output side of the design target integrated circuit and the posterior element thereof, the variation parameter, the wiring RC information, the cell library, the determination value for determining the delay time, etc (S102).

Herein, the constrained condition (slew) designates a condition for establishing the connection with the external circuit, i.e., designates the input slew with respect to the design target integrated circuit. The constrained condition (slew) is specified by, e.g., a waveform of the ramp input.

On the other hand, the constrained condition (Cap) designates a constrained condition related to the posterior capacitance. Note that the external storage device 13 or the main storage device 12 stored with the constrained condition (slew) corresponds to an input signal condition storage unit.

The variation parameter is defined as a value for specifying which range the variation of the physical property information is caused in. The variation parameter is applied to the physical property information of the transistor of each cell contained in the cell library or the physical property information (the resistance RL and the capacitance CL) of the metal wire. As a result, the design supporting device 10 causes fluctuations of the physical property information of the transistor or of the physical property information of the metal wire within the range of the variation parameter.

Note that the variation parameter may take different values on a per physical-property-information basis, and may take values in common with plural items of physical property information. Further, the variation parameter may be set in common with all items of physical property information through one process of the MSTA.

The wiring RC information contains the resistance value (RL) and the capacitance (CL) of the metal wire layer of each of the portions within the integrated circuit. Moreover, the determination value in FIG. 22A is a determination value used when determining the delay time as well as being termed a signal level determination value. This determination value, as indicated by VDD/2 on the axis of ordinates in FIG. 17, specifies the signal level when determining the delay time.

Next, the design supporting device 10 selects the delay calculation target cell (S103). Then, the design supporting device 10 determines whether the delay calculation target cell is an input cell or not (S104). Herein, the input cell connotes a cell which receives the input signal from the outside and also implies a cell in which the constrained condition (slew) with respect to the input signal is imposed. The CPU 11 of the design supporting device 10 executes a process in S104 as a first determination unit which determines whether the element is an input element or not.

If the delay calculation target cell is the input cell, the design supporting device 10 sets an input signal waveform by use of the constrained condition (slew) (S105). Whereas if the delay calculation target cell is not the input cell, the design supporting device 10 sets the input signal waveform by employing the signal waveform of the output signal of the anterior cell. A signal waveform of the output signal is called an output slew.

Next, the design supporting device 10 determines whether the delay calculation target cell is the output cell or not (S107). Herein, the output cell connotes a cell which outputs the output signal to the outside and implies a cell in which the constrained condition (Cap) is imposed on the circuit on the output side.

If the delay calculation target cell is the output cell, the design supporting device 10 calculates the delay time by use of the constrained condition (Cap) (S108). Whereas if the delay calculation target cell is not the output cell, the design supporting device 10 calculates the delay time of the metal wire by employing the wiring RC information (S109). Note that a value with the variation of the delay time of the metal wire may also be generated by causing fluctuations of the wiring RC information within the predetermined range.

Next, the design supporting device 10 generates the physical property information of the transistor the designated number of trial count "n" times within the range of the variation parameter. Then, the design supporting device 10 calculates, based on the thus-generated physical property information, the current value and the moving time of the operation point in accordance with the mathematical expressions 1-6, and thus generates the current table (S110). Through the processes described above, the current table corresponding to the trial count "n" is generated.

Then, the design supporting device 10 forms the output signal waveform (output slew) of the cell (S111). The process in S111 is also repeated trial count "n" times. Accordingly, the output signal waveforms (output slew) of which the number corresponds to the trial count "n" are generated. Note that an arrowhead indicated by the trial count "n" in FIGS. 22A and 22B represents the iterative executions of the processes in S110 and S111.

Next, the design supporting device 10 executes the cell delay calculation of the delay calculation target cell (S112). The cell delay calculation is defined as a process of calculating, as illustrated in FIG. 18, a time difference between the input signal (e.g., Vin in FIG. 18) and the output signal (Vds@RC) in the determination value when determining the delay time. As a result of the cell delay calculation, the periods of cell delay time, of which the number corresponds to the trial count "n", are calculated.

The CPU 11 of the design supporting device 10 executes the computer program deployed in the execution-enabled status on the main storage device 12, and executes, as an element delay calculation unit, the processes in S110 and S112.

Next, the design supporting device 10 determines whether or not the delay calculations are performed with respect to all the cells within the path (S113). If the delay calculations are not performed with respect to all the cells within the path, the design supporting device 10 loops the control back to S103.

Whereas if the delay calculations are performed with respect to all the cells within the path, the design supporting device 10 executes a path delay calculation (S114). As a result of the cell delay calculations, the calculations are done by the number corresponding to the trial count "n" in the format of SDF (Standard Delay Format). Note that in the case of calculating the path delay time from the periods of delay time of the plurality of cells within the path in S114, for instance, the path delay time is calculated by adding the delay time, corresponding to the same trial count, of each cell. For example, the delay time of each cell in the path is added with respect to the first time of the trial count, and the path delay time is calculated with respect to the first time of the trial count. This operation is the same from the second time onward. The CPU 11 of the design supporting device 10 executes the computer program deployed in the execution-enabled status on the main storage device 12, and executes, as a propagation time calculation unit, the process in S114.

Subsequently, the design supporting device 10 iteratively executes the STA about the path delay time (SDF) corresponding to trial count "n" times (S115, S116). A result of the STA is recorded in a timing report file. Further, the design supporting device 10 generates display data representing the delay time distribution such as the histogram from the path delay time (SDF) corresponding to the trial count "n" times, and displays the display data on the display device 14.

FIG. 23 is a flowchart illustrating details of the process (details of S110 in FIG. 22A) of generating the current table. In this process, the design supporting device 10 generates the physical property information of the transistor within the predetermined variation range (S1100). The CPU 11 of the design supporting device 10 executes, as a physical property value generation unit, a process in S1100 of FIG. 23.

Next, the design supporting device 10 calculates the transition time tAB from the saturation operation point A to the non-saturation operation point B (S1101). In S1101, the design supporting device 10 may simply carry out the calculation of the mathematical expression 2. The CPU 11 of the design supporting device 10 executes, as a first calculation unit, the computer program deployed in the execution-enabled status on the main storage device 12, and carries out the process in S1101.

Subsequently, the design supporting device 10 calculates the transition time tBC from the non-saturation operation point B to the non-saturation operation point C (S1102). In S1102, the design supporting device 10 may simply execute the calculation of the mathematical expression 6. The calculation in the mathematical expression 6 is, however, in fact, the integral calculation in the mathematical expression 5. Such being the case, it is enough for the design supporting device 10 to simply calculate the value of Ids when changing Vds. Then, the design supporting device 10 changes the Vds in unit time, e.g., 1 ps increments, and may simply perform the integral calculation by sequentially adding these values.

Moreover, the design supporting device 10 calculates the transitions, on the time-base, of the drain current Ids and the drain-to-source voltage Vds from the non-saturation operation point C to the operation point at which the drain current becomes 0 (drain current=0) (S1103). This process, similar to S1102, is a process of sequentially calculating the value of Ids when changing Vds in the mathematical expression 5. A procedure of the integral calculation in this case is the same as the procedure described in FIG. 14. The CPU 11 of the design supporting device 10 executes, as a second calculation unit, the computer program deployed in the execution-enabled status on the main storage device 12, and carries out the processes in S1102 and S1103.

The design supporting device 10, through the processes in S1101-S1103, can easily calculate the time change in the state between the saturation region and the non-saturation region, which largely affects the delay time of the transistor. Accordingly, it is feasible to attain the delay time calculation which reflects a phenomenon largely affecting the delay time of the transistor even when not analyzing the strict differential equation as by, e.g., the SPICE simulation.

Next, the design supporting device 10 associates the drain current Ids with the drain-to-source voltage Vds on the basis of the time basis (S1104). Further, the design supporting device 10 adds the record corresponding to the delay time which accompanies the change in input signal to the current table (S1105). The delay time accompanying the change in input signal corresponds to the delay time associated with the input slew or the delay time associated with the output slew of the anterior transistor. In these periods of delay time, the delay time associated with the input slew is set by the processes in S104-105 in FIG. 22A. Moreover, the delay time associated with the output slew of the anterior transistor is set by the processes in S104 and S106. The CPU 11 of the design supporting device 10 executes, as an input dependence adding unit, the processes in S104-S106 in FIG. 22A and the process in S1105 in FIG. 23. The process in FIG. 1105 enables the influence of the rising time or falling time of the input signal to be easily reflected.

Further, the design supporting device 10 adds the delay time associated with the constrained condition (Cap) or the load RC (S1106). As the delay time of the load RC, the delay time associated with the constrained condition (Cap) or the wiring RC information is calculated by the processes in S107-S109 in FIG. 22A. Accordingly, the delay time can be calculated in distinction between the transistors on which the constrained condition (Cap) is imposed and the not-imposed transistors in the integrated circuit. Further, if the in distinction between (Cap) is not imposed, the delay time can be calculated with high accuracy and simplicity by use of the wiring RC of the posterior cell.

As discussed above, the design supporting device 10 according to the second working example, in the case of performing the delay time calculation of the path within the integrated circuit, produces the variation of the delay time by causing the fluctuation of the characteristic of the element such as the transistor embraced by the path or the physical property information of the metal wire layer, trial count "n" times, within the range of the variation parameter. The variation parameter may be determined based on the empirical value of the variation in, e.g., the manufacturing process. The variation parameter can be also changed based on the user's designation in a way that sets the empirical value of the variation in the manufacturing process as a default value.

Accordingly, at the design stage of the integrated circuit, the delay time with respect to each of the paths in the integrated circuit is calculated, and, in the case of executing the STA, it is feasible to calculate the delay time in which the variation of the physical property information is reflected. As a result, the variation of the delay time, which corresponds to the variation of the physical property information, can be acquired. Accordingly, the designer may simply set, based on the variation state and the variation distribution of the delay time, the check value of the delay time that is to be determined to be an error in the STA. For instance, in order to set the error count less than a p-count, the determination as to what value may be set as the check value of the delay time can be made from the variation state and the variation distribution of the delay time.

A measure for relaxation in such a case that the check value of the delay time determined to be the error in the STA is too strict has hitherto involved applying the SSTA. The SSTA adopts a technique of relaxing the check value of the delay time within a range of a statistically allowable error count in a manner that handles the delay time of each element as the statistics having the distribution.

The design supporting device 10 according to the second working example, however, calculates the variation of the delay time of the path within the integrated circuit in accordance with the formulae of the current Ids in the mathematical expressions 1-6 by obtaining the variation of the physical property information. Therefore, as compared with the SSTA involving the statistical handling, the influence of the variation of the physical property information in the target circuit can be reflected in the path delay time, thereby enabling the timing analysis to be done more accurately than the SSTA.

Moreover, the design supporting device 10 in the second working example acquires, based on the formulae of the mathematical expressions 1-6, to begin with, a readily-calculable output current value (drain current Ids) and the transition time from the saturation state to the non-saturation state, depending on whether the transistor is in the saturation state or the non-saturation state. Moreover, the design supporting device 10 obtains the output voltage value from the output current value and further obtains the delay time from the relation between the input voltage and the output voltage. Still further, the design supporting device 10 calculates the transition time by use of an analyzable drain current formula by substituting the numerical value (drain voltage Vds) into an approximate function as in the mathematical expressions 1-6, and acquires the transition time of the drain-to-source voltage according to the transition time. Furthermore, the fixed value is applied to the delay time accompanying the rising and the falling of the input voltage, which show a small rate at which to occupy the delay time. Accordingly, the delay time corresponding to the state transition of the transistor can be acquired with an extremely small amount of calculations as compared with the SPICE simulation for obtaining the delay time based on, e.g., the differential equation of the element. Because of adopting the configuration and calculation procedures described above, even when changing at random the physical property information of the integrated circuit within the predetermined range in the case of even the plural trial count "n", the amount of calculations increases to a degree proportional to a product of the amount of calculations in the mathematical expressions 1-6 and the trial count "n".

Moreover, the analysis in which the manufacturing variation is reflected can be done by using, e.g., the mobility $\mu 0$ of the carrier in the semiconductor substrate, the gate capacitance Cox (further, the relative permittivity and the film thickness of the oxide film) per unit square measure, the gate width W, the gate length L, the threshold voltage Vth of the transistor, the transistor capacitance C including the drain-to-gate capacitance of the transistor and the resistance RL and the capacitance CL of the metal wire as the physical property information of the integrated circuit.

Accordingly, for instance, if given the manufacturing empirical values of the variations of the accumulated-in-the-past physical property information of the integrated circuits, the design supporting device 10 in the second working example can determine, before the trial manufacture of the actual integrated circuit, the check value of, e.g., the STA after analyzing the delay time at the design stage, executing the STA and estimating the variation of the delay time.

<Calculation Processing Example of Output Slew>

As illustrated in FIGS. 22A and 22B, according to the design supporting device 10, in the cells contained in the delay time calculation target path, the rising characteristic or the falling characteristic (output slew) of the output signal of the intra-path cell becomes the rising characteristic or the falling characteristic (input slew) of the input signal of the posterior cell. An in-depth description of a process of determining the rising characteristic or the falling characteristic (output slew) of the output signal of the cell will hereinafter be made with reference to FIGS. 24 through 28.

Figure 24:
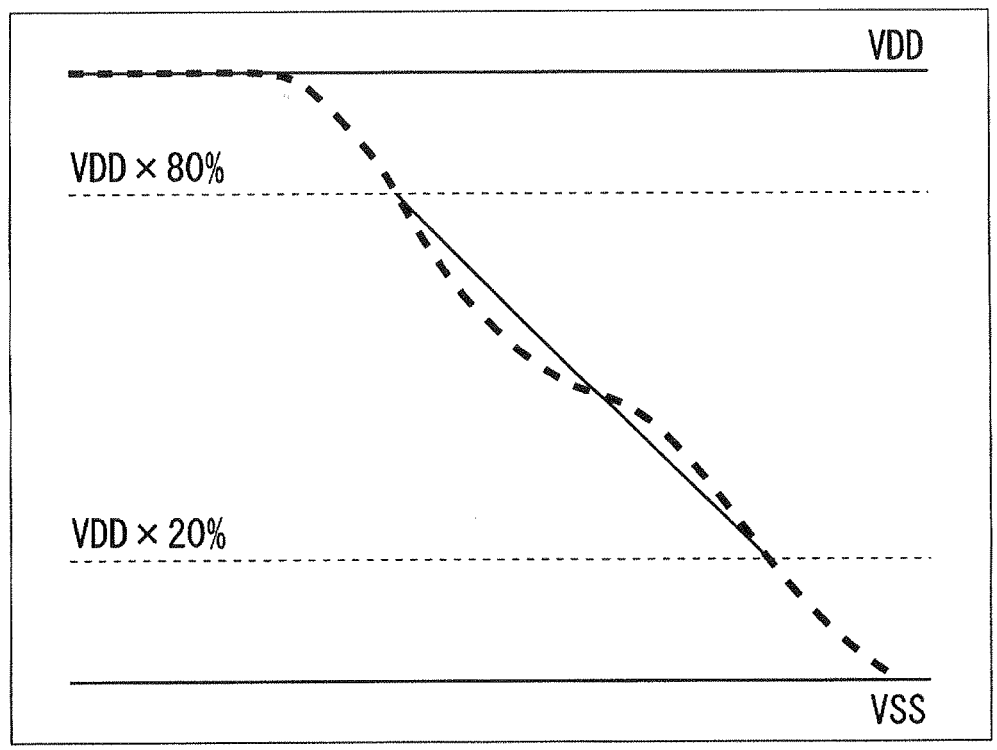
FIG. 24 is a plot diagram of plotting the output voltages on the basis of the current table, in which the time is given on the axis of abscissa, and the output voltage is given on the axis of ordinates.

FIGS. 24 through 28 are diagrams illustrating the details of the process (S111 in FIG. 22B) of generating the output signal waveform (output slew) of the cell. FIG. 24 is the diagram of plotting the output voltage Vds on the basis of the current table acquired in the process in S110 of FIG. 22A, in which the time is given on the axis of abscissa, and the output voltage Vds is given on the axis of ordinates. The design supporting device 10 accepts the user's input operation from the operation unit 15, and also accepts the determination interval for determining the output signal waveform. In the example of FIG. 24, an interval in which the voltage Vds transitions in a range of 20%-80% with respect to the source voltage VDD is set as a gradient determination interval for determining a gradient of the output signal waveform. Note that a default value of the interval for determining the gradient of the output signal waveform may previously be set in a parameter file etc. It is to be noted that VSS in FIG. 24 denotes the source voltage connected to the source, and VDD represents the source voltage connected to the drain. In the discussion of the second working example, unless specified otherwise, VSS=0, and VDD is the source voltage.

Figure 25:
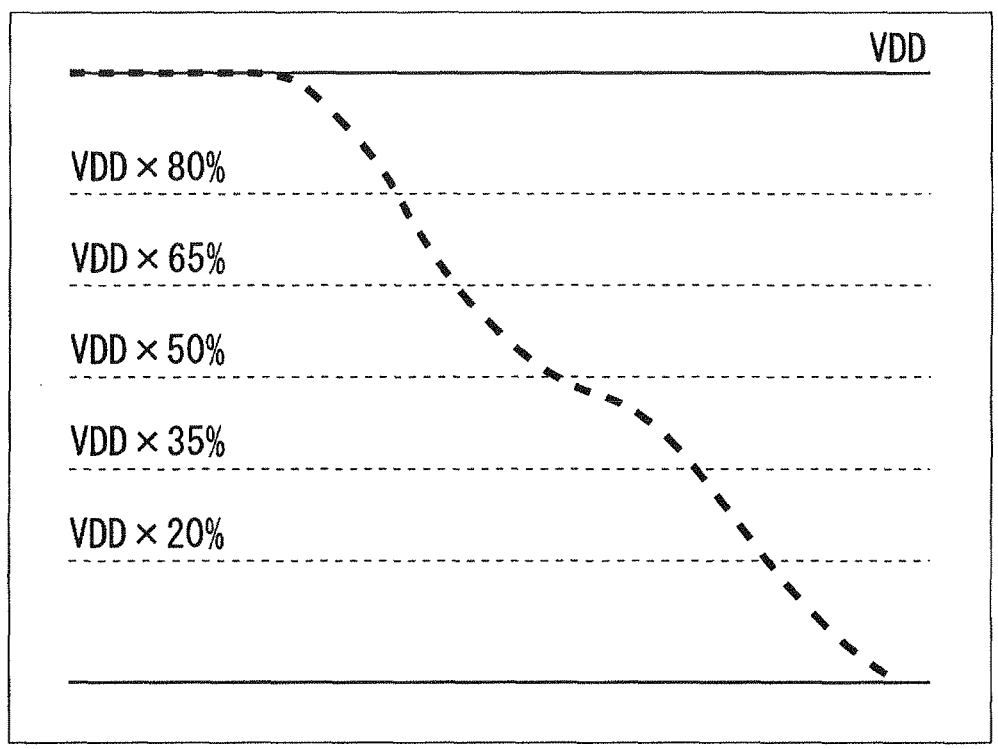
FIG. 25 is a diagram illustrating an example of segmenting a gradient determination interval.

Next, the design supporting device 10 segments the gradient determination interval into a plurality of sub-intervals. FIG. 25 illustrates an example in which the gradient determination interval is segmented by 4. The sub-intervals into which the determination interval is segmented will hereinafter be called segmented intervals. Thus, the design supporting device 10 may accept a segment count for segmenting the determination interval for determining the output signal waveform through the user's input operation from on the operation unit 15. Further, a default value of the segment count may be set beforehand in the parameter file etc.

Next, the design supporting device 10 linearly approximates the output signal waveform in each segmented interval, thus obtaining rising time in each interval. Moreover, the rising time in the whole determination interval is acquired. Obtained further is the rising time in each segmented interval, into which the rising time in the whole determination interval is converted.

For example, in the example of FIG. 25, the determination interval is an interval defined by 80%-20% of the source voltage VDD, and the segmented intervals are intervals of 80%-65%, 65%-50%, 50%-35% and 35%-20% of VDD. Then, let Tsout be the rising time of the whole determination interval, and the rising time Tso in each interval, into which Tsout is converted, is determined such as Tso=Tsout/4.

Next, the design supporting device 10 determines whether or not the thus-calculated rising time in each segmented interval is within the range of the allowable differential value by making a comparison with the falling time of the whole determination interval. Namely, the design supporting device 10 determines whether or not the gradient of the output signal in each segmented interval diverges an allowable value or more from the gradient of the whole determination interval.

Figure 26:
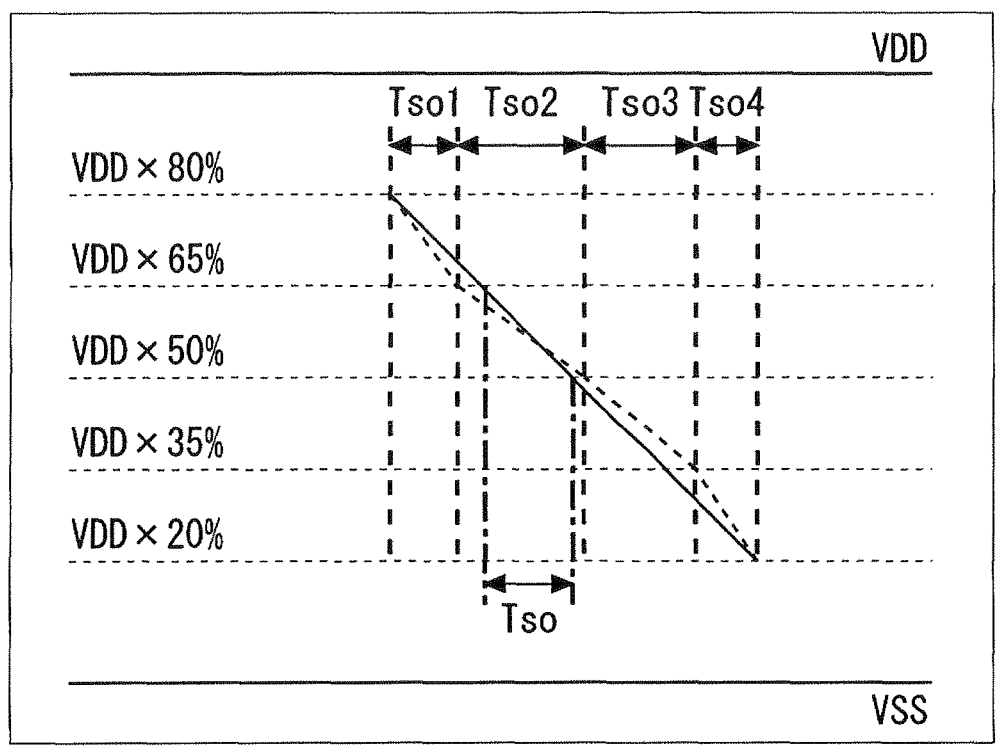
FIG. 26 is a diagram of comparing an output signal waveform of the whole gradient determination interval with an output signal waveform in each segmented interval.

FIG. 26 is a diagram illustrating a comparison between the output signal waveform in the whole determination interval and the output signal waveform in each segmented interval. A graph of a solid straight line in FIG. 26 represents the gradient of the whole determination interval, and a dashed straight line indicates the gradient of the segmented interval. In FIG. 26, in the interval of 80%-65% of VDD, the rising time is given by Tso1. Further, in the interval of 65%-50% of VDD, the rising time is given by Tso2. Still further, in the interval of 50-35% of VDD, the rising time is given by Tso3. Yet further, in the interval of 35%-20% of VDD, the rising time is given by Tso4.

The design supporting device 10, if any one of the rising time Tso1, Tso2, Tso3 and Tso4 in the segmented intervals diverges the allowable value or more from the rising time Tso in the segmented interval into which the rising time Tsout of the whole determination interval is converted, corrects the rising time Tsout of the whole determination interval.

Figure 27:
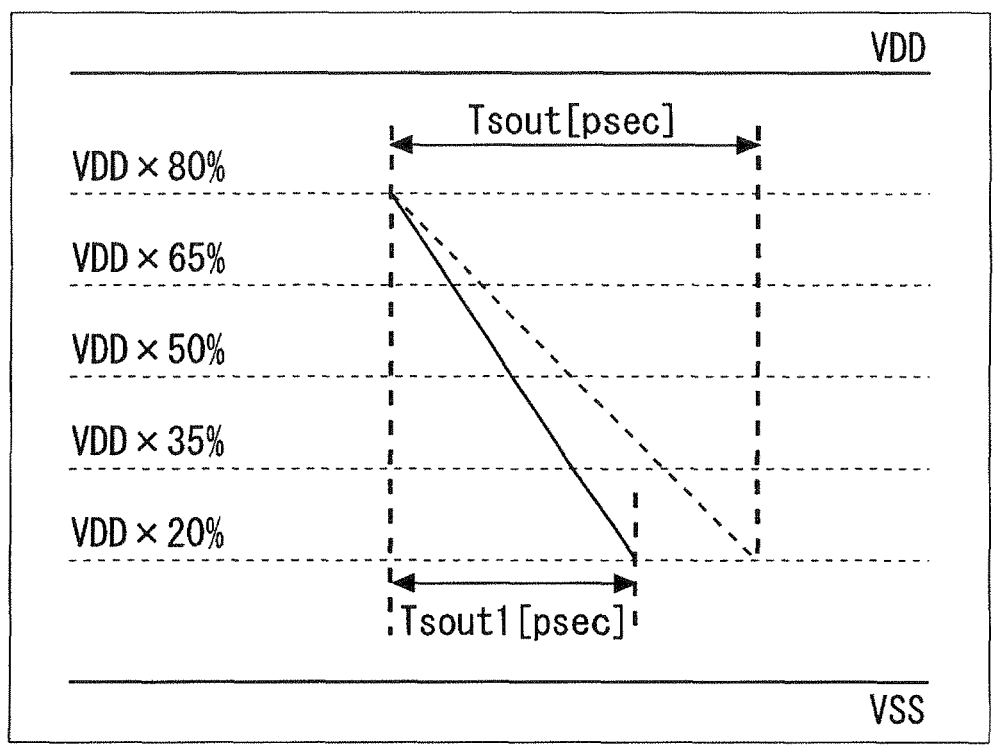
FIG. 27 is a diagram illustrating an example of how fall time of the whole determination interval is corrected based on the fall time of a 80%-65% interval of a supply voltage.

FIG. 27 illustrates an example of correcting the falling time of the whole determination interval on the basis of the falling time Tso1 in the 80%-65% interval of the source voltage VDD. A graph of a solid straight line in FIG. 27 represents the gradient of the whole determination interval, and a dashed straight line corresponds to the falling time Tso1. The segmented interval defined as a basis for correction may be selected by, e.g., the user's designation. Further, the falling time Tso1 may be used as a median when sorting the periods of falling time in the plurality of segmented intervals. Moreover, the falling time Tso1 may be used as a value of the falling time which reaches a distribution peak when creating the histogram by collecting the periods of falling time in the plurality of segmented intervals. Note that in the case of correcting the falling time, the signal changing direction is reversed, however, the processing procedure is basically the same as the falling case.

Figure 28:
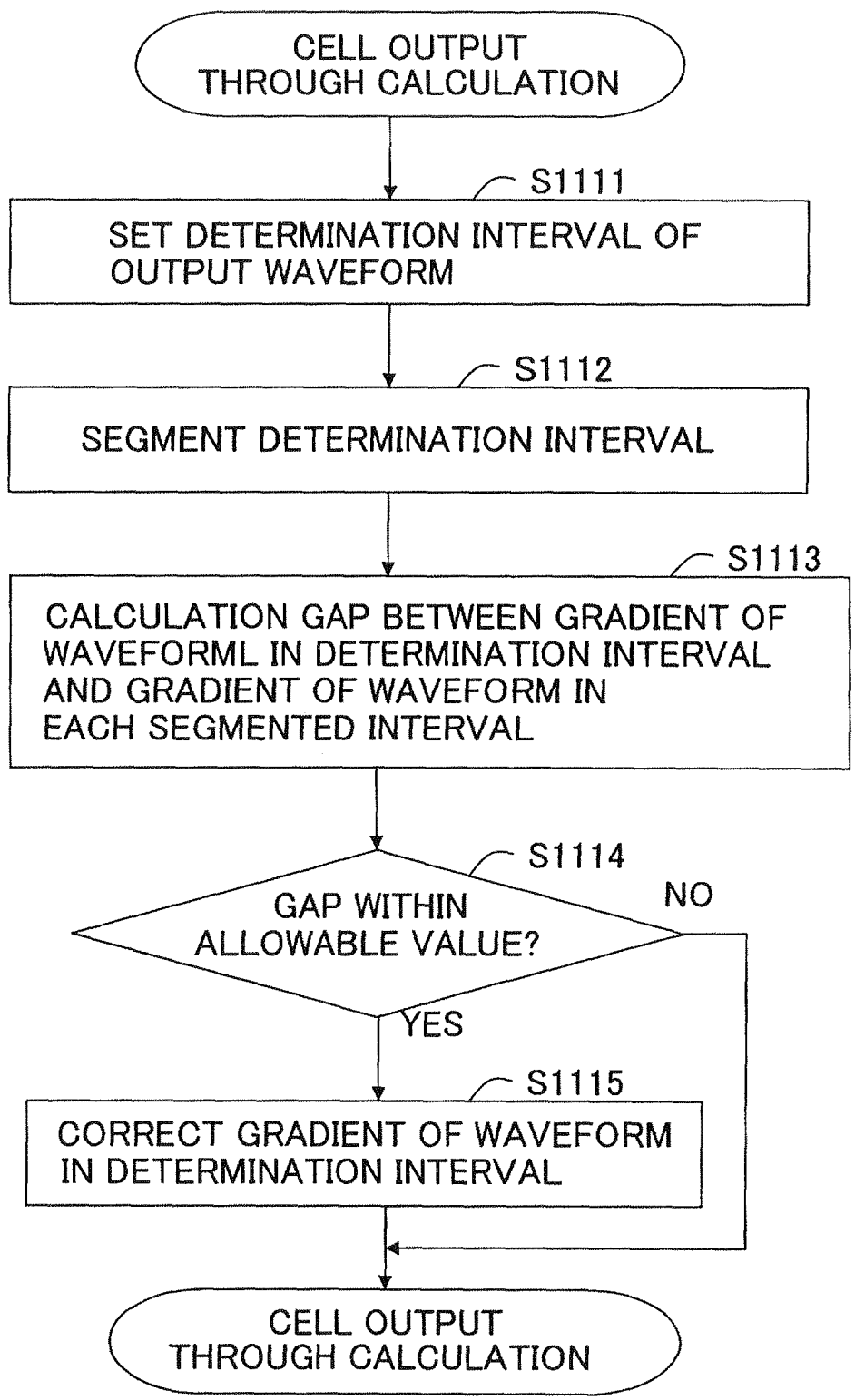
FIG. 28 is a flowchart illustrating a cell output slew calculation process.

FIG. 28 is a flowchart illustrating a cell output slew calculation process. In this process, the design supporting device 10 sets the determination interval of the output waveform (S1111). The determination interval of the output waveform is designated such that the output voltage Vds is within the range of 20%-80% of the source voltage VDD. The design supporting device 10 may retain the determination interval of the output waveform in the parameter file. Further, the design supporting device 10 may accept the setting value of the determination interval of the output waveform according to the user's operation.

Next, the design supporting device 10 segments the determination interval of the output waveform (S1112). The design supporting device 10 may segment the determination interval in accordance with, e.g., a designation of the parameter file. For example, designations of the segment count and segment boundary values may be retained in the parameter file. Moreover, the designations of the segment count and equi-segmentation may also be retained in the parameter file. Still further, the design supporting device 10 may accept the setting values of the segment count and the segment boundary values on the basis of the user's operation.

Next, the design supporting device 10 calculates the divergence between the gradient of the waveform in the determination interval and the gradient of the waveform in each segmented interval (S1113). Then, the design supporting device 10 determines whether the divergence is within an allowable value or not (S1114). The CPU 11 of the design supporting device 10 executes, as a second determination unit, the computer program deployed in the execution-enabled status on the main storage device 12, and carries out the process in S1114.

If the divergence exceeds the allowable value, the design supporting device 10 corrects the gradient of the waveform in the determination interval (S1115). This is because the gradient of the waveform in the whole determination interval of the output waveform is considered to be improper for performing the linear approximation of the gradient of the waveform in the individual segmented interval. The CPU 11 of the design supporting device 10 executes, as a correcting unit, the computer program deployed in the execution-enabled status on the main storage device 12, and carries out the process in S1115.

As discussed above, the design supporting device 10 sets the determination interval of the output waveform through the user's designation, the designation of the parameter, etc. Further, the design supporting device 10 determines whether or not there is any divergence between the gradient of the waveform in the determination interval of the output waveform and the gradient of the waveform in each of the segmented intervals into which the determination interval is segmented. Still further, if there is the divergence of the gradient of the output waveform between the determination interval of the output waveform and any one of the segmented intervals and if this divergence exceeds the allowable value, the design supporting device 10 corrects the waveform gradient in the whole determination interval of the output waveform on the basis of the waveform gradient in any one of the segmented intervals.

Thus, the gradient of the waveform in the whole determination interval of the output waveform is corrected by use of the waveform gradient in the narrow segmented interval, whereby the error due to the calculations of the falling time and the rising time can be restrained based on the waveform in the interval with no change of the output waveform. Considered are, e.g., a case where the output waveform falls to LO (e.g., 0 v) from HI (e.g., 1.8 v) and a case where an initial portion (the left side on the time-basis) of the determination interval of the output waveform contains a flat waveform. In these cases, when calculating the gradient of the waveform in the whole determination interval of the output waveform, the waveform gradient becomes gentler to such a degree as to contain the flat portion than the original gradient. Such being the case, as in the processes of FIG. 28, the error can be restrained by correcting the gradient of the output waveform on the basis of the waveform gradient in any one of the segmented intervals. For instance, in FIG. 27, the rising time Tsout in the whole determination interval is corrected based on the falling time Tso1 in the 80%-65% interval of VDD.

The selection of the segmented interval as a basis for the correction may involve using the value of the user's designation, the median of the waveform gradients and the gradient having the highest frequency in the gradients when collecting the waveform gradient distributions (histograms).

<Case in Which Signal Level Determination Value for Calculating Delay Time Differs on Per-Cell-Basis>

Figure 29:
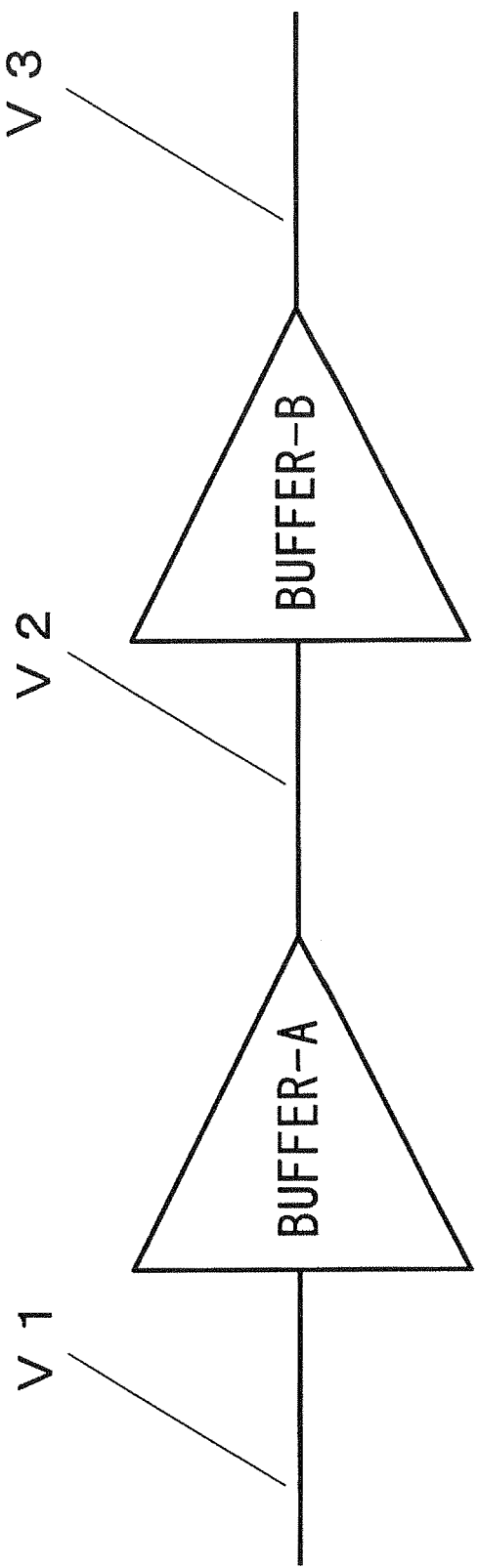
FIG. 29 is a diagram illustrating a circuit in which two buffers are connected in series.

The first and second working examples handle the processing on the premise that the periods of delay time of the plurality of cells or transistors on the path are the same. For example, the signal level for calculating the delay time, i.e., the time difference when the input voltage and the output voltage become ½ of the source voltage VDD, is calculated as the delay time. There exists, however, a case, if the two cells, e.g., a buffer A and a buffer B are connected in series on the path, in which the signal level determination value for calculating the delay time differs in the buffer A and the buffer B. FIG. 29 illustrates a circuit in which the buffer A and the buffer B are connected in series. For instance, this is a case in which the buffer A is the cell including a fast type transistor, and the buffer B includes a low power consumption type transistor. Thus, if the cell type is different, for instance, the threshold voltage Vth becomes different. Thereupon, such a case might exist, that the signal level determination value for calculating the delay time differs with respect to, e.g., the input voltage Vin or the output voltage Vds on a per cell library basis.

For example, by standards, the signal level determination value for calculating the delay time is 50% of VDD; the signal level determination value of the buffer A is 40% of VDD with respect to both of the input voltage Vin and the output voltage Vds; and the signal level determination value of the buffer B is 50% of VDD with respect to the input voltage Vin and 80% of VDD with respect to the output voltage Vds.

Now, as in FIG. 29, the buffer A and the buffer B are connected in series, in which case V1 represents the input voltage of the buffer A, V2 indicates the output voltage of the buffer A and also the input voltage of the buffer B, and V3 denotes the output voltage of the buffer B.

Figure 30:
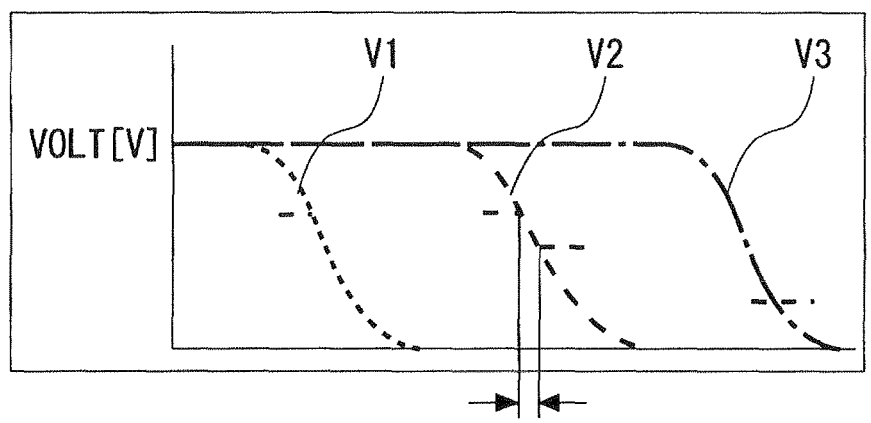
FIG. 30 is a diagram illustrating an example a signal level determination value for calculating the delay time differs in the two buffers.

FIG. 30 illustrates an example in which the signal level determination value for calculating the delay time differs in the buffer A and the buffer B. For example, this is a case in which the signal level determination value of the output voltage V2 in the buffer A is 50% of the source voltage VDD, while the signal level determination value of the input voltage V2 in the buffer B is 40% of the source voltage VDD. In this case, unlike the case of calculating the delay time on the basis of the same signal level determination value, there occurs an error of the delay time due to a difference between the signal level determination values.

Figure 31:
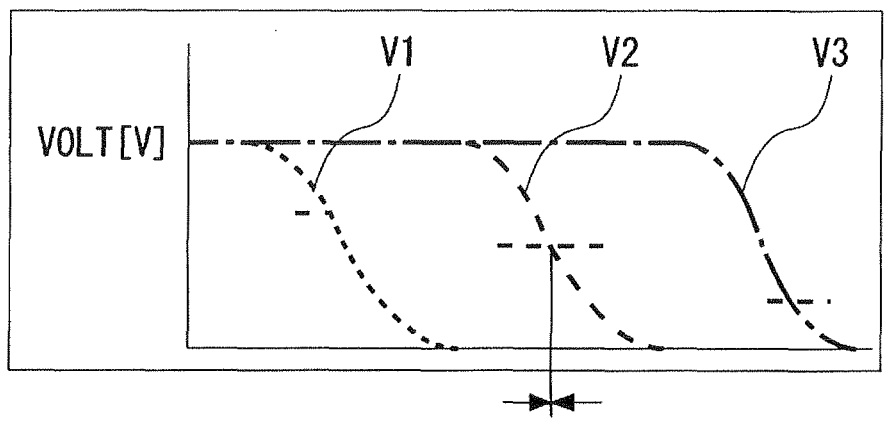
FIG. 31 is a diagram illustrating an example of correcting the signal level determination value by the two buffers having the different signal level determination values for calculating the delay time.

This being the case, the design supporting device 10 employs the signal level determination value of the input voltage of the posterior cell in place of using the signal level determination value of the output voltage of the anterior cell. Then, for instance, if the signal level determination value of the output voltage of the anterior cell is higher than the signal level determination value of the input voltage of the posterior cell and if the output signal falls, the design supporting device 10 calculates the transition time till the signal level determination value of the output voltage of the anterior cell reaches the signal level determination value of the input voltage of the posterior cell. Subsequently, the design supporting device 10 adds a length of this transition time to the path delay time. The transition time may be calculated from, e.g., the gradient of the output waveform. The gradient of the output waveform in this case may involve using the post-correction gradient of the output waveform according to the processes in FIG. 28. FIG. 31 is a diagram illustrating an example of correcting the signal level determination value by the two buffers (the buffer A and the buffer B) having the different signal level determination values for calculating the delay time.

Figure 32:
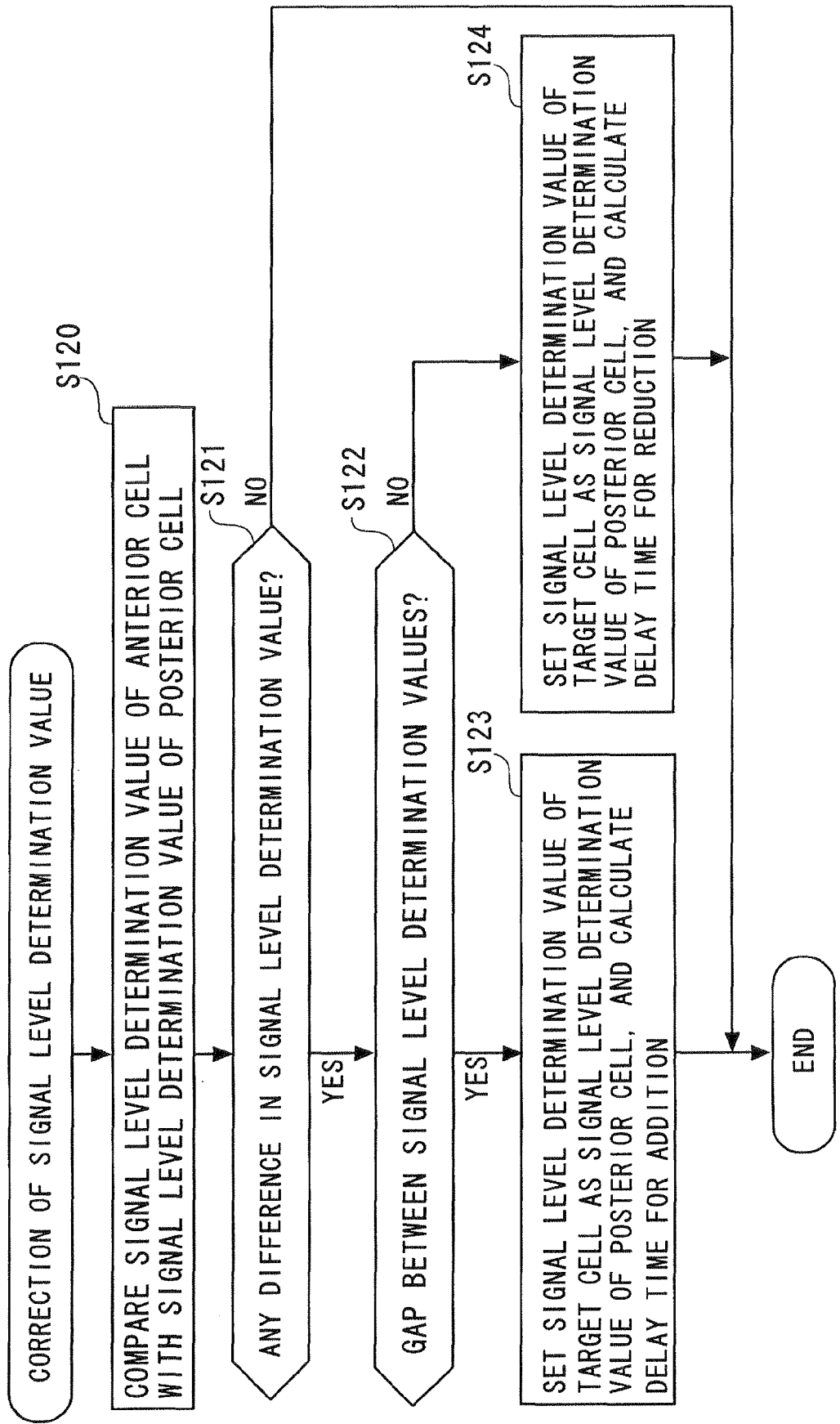
FIG. 32 is a diagram illustrating a procedure of a signal level determination value correction process.

FIG. 32 illustrates a procedure of the signal level determination value correction process. The design supporting device 10, at first, compares the signal level determination values for calculating the delay time with each other between the target cell and the posterior cell on the delay time calculation target path (S120). The signal level determination values for calculating the delay time of the respective cells are stored in, e.g., the cell library in FIG. 22A.

Then, if there is a difference in terms of the signal level determination values between the target cell and the posterior cell on the delay time calculation target path, the design supporting device 10 determines next whether the difference in terms of the signal level determination values corresponds to a level gap or not (S122). The "gap" implies a case in which the signal level determination value of the target cell does not reach the signal level determination value of the posterior cell in the waveform changing direction. This implies, for example, in the case of the falling waveform, a case where the signal level determination value of the posterior cell is smaller than the signal level determination value of the target cell. This implies, whereas in the case of the rising waveform, a case where the signal level determination value of the posterior cell is higher than the signal level determination value of the target cell.

When determining in S122 that there is the gap, the design supporting device 10 sets the signal level determination value of the posterior cell in the signal level determination value of the target cell, and calculates an additional value to the delay time (S123). The additional value to the delay time can be calculated such as: Additional Value to Delay Time=Differential Value d between Signal Level Determination Value of Target Cell and Signal Level Determination Value of Posterior Cell/Gradient a.

Further, when determining in S122 that there is no gap, conversely, this corresponds to a case in which the signal level determination values are overlapped (or overrun) with each other between the target cell and the posterior cell on the delay time calculation target path. In this case, the design supporting device 10 sets the signal level determination value of the posterior cell in the signal level determination value of the target cell, and calculates a reduction value of the delay time (S124). This is because of having already reached the signal level determination value of the posterior cell before reaching the signal level determination value of the target cell. The reduction value of the delay time can be calculated such as: Reduction Value of Delay Time=Differential Value d between Signal Level Determination Value of Target Cell and Signal Level Determination Value of Posterior Cell/Gradient a.

Note that when simply calculating the correction value such as: Correction Value=(Signal Level Determination Value of Posterior Cell−Signal Level Determination Value of Target Cell)/Gradient a, a positive value is given in the case of there being the gap, but a negative value is given in the case of being overlapped (overrun). Then, the calculation in the formula of the correction value is done in a way that aggregates the processes in S122-S124, whereby the delay time may be corrected. The CPU 11 of the design supporting device 10 executes, as a reference setting unit, the computer program deployed in the execution-enabled status on the main storage device 12, and carries out the processes in S122-S124.

Through the processes described above, as illustrated in FIG. 31, the signal level determination value of the output voltage of the anterior cell is coincident with the signal level determination value of the output voltage of the posterior cell. Further, the delay time depending on the difference between the signal level determination value of the output voltage of the anterior cell and the signal level determination value of the output voltage of the posterior cell, can be reflected in the delay time of the MSTA analysis target path.

<Processing Example of Timing Analysis>

Figure 33:
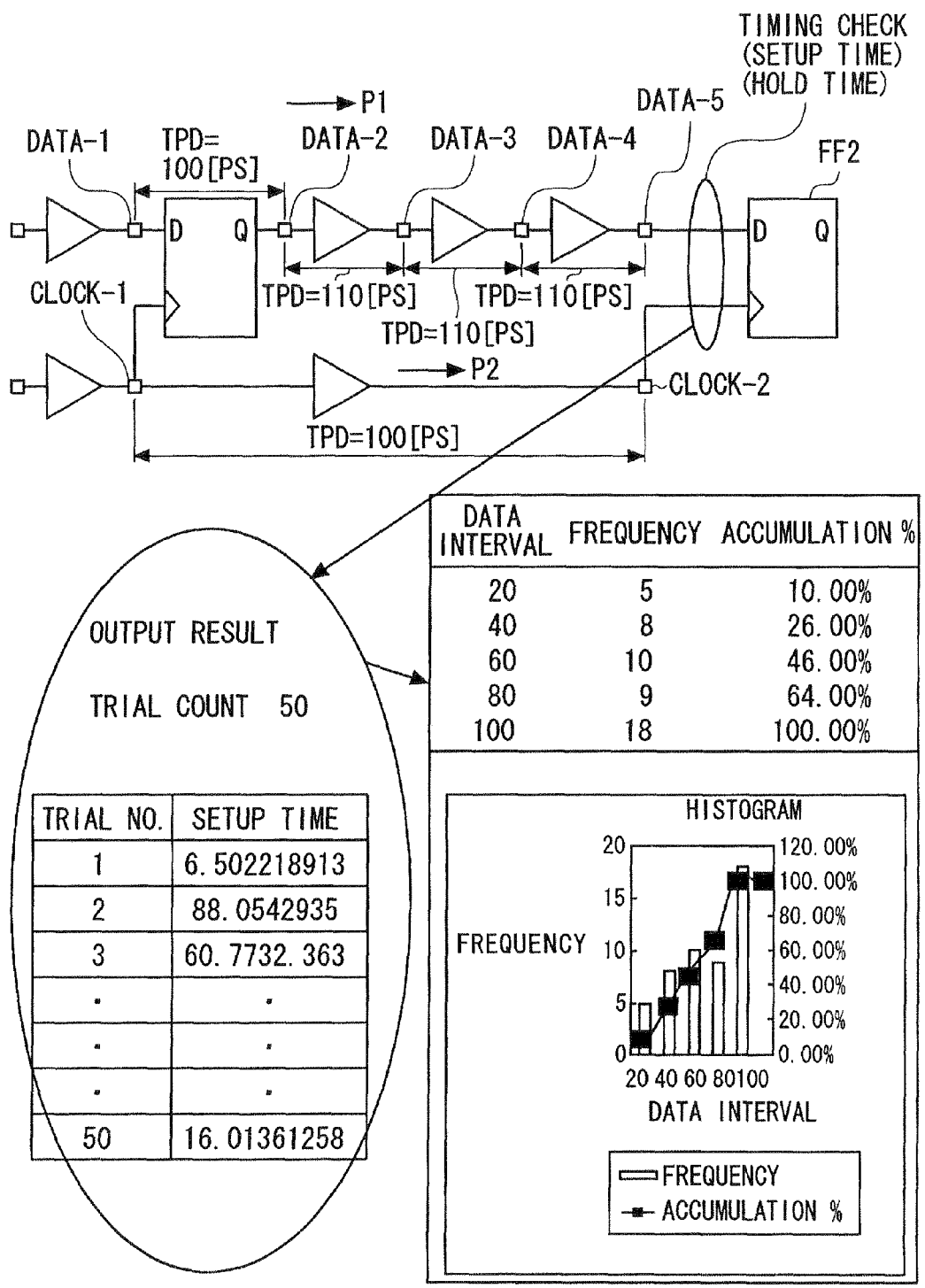
FIG. 33 is a diagram illustrating an example of processing a result of the timing analysis.

FIG. 33 illustrates a processing example of a result of the timing analysis. In the example of FIG. 33, the MSTA is executed with the trial count "n"=50 with respect to the integrated circuit including the same paths P1 and P2 as those in FIG. 2.

As illustrated in FIG. 33, as a result of the MSTA-based timing analysis, for instance, setup time distributions are collected with respect to the flip-flop FF2 and can be described in the histogram format. Further, it is feasible to describe an accumulation graph showing accumulated distributions, extending from a data section having a small setup time value toward a data section having a large value. For example, in FIG. 33, a polygonal line which connects rectangles is the accumulation graph.

The MSTA, as in FIG. 33, for instance, enables the frequencies of the setup time and the accumulation values to be collected. Then, the user can grasp the error frequency when the variation of the physical property is caused on the basis of the reference value of the setup time from the setup time distributions corresponding to the trial count.

Moreover, conversely the user can, when given the error frequency with respect to the setup time distribution, determine the reference value of the setup time so as to become this error frequency. Namely, the user can determine the reference value of the setup time so as to become the designated error frequency on the basis of the delay time distribution acquired by the MSTA with respect to the in-design integrated circuit. For example, if the user desires to set the frequency to 5 or less as the setup time error between the path P1 and the path P2 in FIG. 32, the user may simply set the STA check value in the position corresponding to a data section 20 with the frequency that is 5 or less.

OTHER MODIFIED EXAMPLES

The first and second working examples have exemplified how the delay time of the integrated circuit containing the variation is calculated according to the model formula in a manner that changes the physical property of the transistor. The application of the first working example is not, however, limited to the transistor. Namely, if the operation of the element other than the transistor can be described by the model formula in the first working example or the model formulae such as the mathematical expressions 1-6 in the second working example, the MSTA can be executed in the same procedures as in the first and second working examples.

The second working example has mainly exemplified the case in which the transistor transitions to the non-saturation from the saturation. The processes in the second working example are not, however, limited to the case where the transistor transitions to the non-saturation from the saturation, but can similarly be applied to the case in which the transistor transitions to the saturation from the non-saturation. According to the embodiment, it is feasible to execute a timing analysis in which to reflect a fluctuation of the delay time accompanying the variation of the circuit characteristic within a design target semiconductor integrated circuit.

<Computer Readable Recording Medium>

It is possible to record a program which causes a computer to implement any of the functions described above on a computer readable recording medium. By causing the computer to read in the program from the recording medium and execute it, the function thereof can be provided.

The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a Blu-ray Disc, a DAT, an 8-mm tape, a flash memory and a memory card. Of such recording media, those fixed to the computer include a hard disk and a ROM.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing device, comprising:
  a processor configured to:
    generate a plurality of post-functional physical property values by causing fluctuations of physical property values for changing a signal propagation time of a target path including a plurality of circuit elements at random within a fluctuation range;
    calculate a delay time of each of signals passing through the circuit element in accordance with each of the generated post-fluctuation physical property values; and
    calculate the signal propagation time of the target path on the basis of the delay time of the signals.

2. The information processing device according to claim 1, wherein the circuit element is a transistor, and
  calculating the delay time of the each of signals includes:
  calculating the delay time of the signals in accordance with a source-to-drain current-voltage characteristic in a saturation region of the transistor; and
  calculating the delay time of the signals in accordance with the source-to-drain current-voltage characteristic in a non-saturation region of the transistor.

3. The information processing device according to claim 1, wherein the processor is further configured to store information specifying a condition of an input signal inputted from outside to an integrated circuit including the plurality of circuit elements,
  wherein calculating the delay time of the each of signals includes:
  determining whether or not each of the circuit elements on the target path is an input element receiving an input of the input signal; and
  adding, with respect to the input element, the delay time depending on the input signal to the signal propagation time, and adding, with respect to the circuit element other than the input element, the delay time depending on an output signal of an anterior element connected to the input side on the target path to the signal propagation time.

4. The information processing device according to claim 1, wherein the processor is further configured to:
  acquire a time when the output signal reaches each of values at plural levels;
  determine whether or not a relation between each value and the time when the output signal reaches each value is within a linear-approximation-enabled allowable range; and
  correct the relation not being within the allowable range so as to fall within the linear-approximation-enabled allowable range.

5. The information processing device according to claim 1, wherein the processor is further configured to match the signal levels between the two circuit elements connected to each other on the target path when different signal levels are designated for the plurality of circuit elements on the target path, and the signal propagation time is defined as a time difference when the input signal and the output signal reach a reference signal level.

6. The information processing device according to claim 1, wherein the generating the plurality of the post-fluctuation physical property values by causing the fluctuations of the physical property values within the fluctuation range is performed according to a random number R and a coefficient D.

7. A non-transitory, computer readable recording medium storing a program to make a computer execute:
  generating a plurality of post-fluctuation physical property values by causing fluctuations of physical property values for changing a signal propagation time of a target path including a plurality of circuit elements at random within a fluctuation range;
  calculating a delay time of each of signals passing through the circuit element in accordance with each of the generated post-fluctuation physical property values; and
  calculating the signal propagation time of the target path on the basis of the delay time of the signals.

8. The non-transitory, computer readable recording medium according to claim 7, wherein the circuit element is a transistor, and
  the calculating the delay time of the each of signals passing through the circuit element includes: calculating the delay time of each of the signals in accordance with a source-to-drain current-voltage characteristic in a saturation region of the transistor; and
  calculating the delay time of each of the signals in accordance with the source-to-drain current-voltage characteristic in a non-saturation region of the transistor.

9. The non-transitory, computer readable recording medium according to claim 7, wherein the program is further configured to make the computer execute reading, from a storage unit, a condition of an input signal inputted from outside to an integrated circuit including the plurality of circuit elements,
  wherein the calculating the delay time of the each of signals passing through the circuit element includes: determining whether or not each of the circuit elements on the target path is an input element receiving an input of the input signal; and adding, with respect to the input element, the delay time depending on the input signal to the signal propagation time, and adding, with respect to the circuit element other than the input element, the delay time depending on an output signal of an anterior element connected to the input side on the target path to the signal propagation time.

10. The non-transitory, computer readable recording medium according to claim 7, wherein the program is further configured to make the computer execute:
  acquiring a time when the output signal reaches each of values at plural levels;
  determining whether or not a relation between each value and the time when the output signal reaches each value is within a linear-approximation-enabled allowable range; and
  correcting the relation not being within the allowable range so as to fall within the linear-approximation-enabled allowable range.

11. The non-transitory, computer readable recording medium according to claim 7, wherein the program is further configured to make the computer execute matching, the signal levels between the two circuit elements connected to each other on the target path when different signal levels are designated for the plurality of circuit elements on the target path,
    wherein the signal propagation time is defined as a time difference when the input signal and the output signal reach a reference signal level.

12. The non-transitory, computer readable recording medium according to claim 7, wherein the generating the plurality of the post-fluctuation physical property values by causing the fluctuations of the physical property values within the fluctuation range is performed according to a random number R and a coefficient D.

13. A design supporting method executed by a computer, comprising:
    generating a plurality of post-fluctuation physical property values by causing fluctuations of physical property values for changing a signal propagation time of a target path including a plurality of circuit elements at random within a fluctuation range;
    calculating a delay time of each of signals passing through the circuit element in accordance with each of the generated post-fluctuation physical property values; and
    calculating the signal propagation time of the target path on the basis of the delay time of the signals.

14. The design supporting method according to claim 13, wherein the circuit element is a transistor, and
    the calculating the delay time of the each of signal passing through the circuit element includes: calculating the delay time of each of the signals in accordance with a source-to-drain current-voltage characteristic in a saturation region of the transistor; and calculating the delay time of each of the signals in accordance with the source-to-drain current-voltage characteristic in a non-saturation region of the transistor.

15. The design supporting method according to claim 13, further comprising reading, from a storage unit, a condition of an input signal inputted from outside to an integrated circuit including the plurality of circuit elements,
    wherein the calculating the delay time of the each of signals passing through the circuit element includes:
    determining whether or not each of the circuit elements on the target path is an input element receiving an input of the input signal; and
    adding, with respect to the input element, the delay time depending on the input signal to the signal propagation time, and adding, with respect to the circuit element other than the input element, the delay time depending on an output signal of an anterior element connected to the input side on the target path to the signal propagation time.

16. The design supporting method according to claim 13, further comprising:
    acquiring a time when the output signal reaches each of values at plural levels;
    determining whether or not a relation between each value and the time when the output signal reaches each value is within a linear-approximation-enabled allowable range; and
    correcting the relation not being within the allowable range so as to fall within the linear-approximation-enabled allowable range.

17. The design supporting method according to claim 13, further comprising:
    matching, the signal levels between the two circuit elements connected to each other on the target path when different signal levels are designated for the plurality of circuit elements on the target path,
    wherein the signal propagation time is defined as a time difference when the input signal and the output signal reach a reference signal level.

18. The design supporting method according to claim 13, wherein the generating the plurality of the post-fluctuation physical property values by causing the fluctuations of the physical property values within the fluctuation range is performed according to a random number R and a coefficient D.

* * * * *

UNITED STATES PATENT AND TRADEMARK OFFICE
CERTIFICATE OF CORRECTION

| | | |
|---|---|---|
| PATENT NO. | : 8,683,401 B2 | Page 1 of 1 |
| APPLICATION NO. | : 13/177096 | |
| DATED | : March 25, 2014 | |
| INVENTOR(S) | : Mitsuru Onodera | |

It is certified that error appears in the above-identified patent and that said Letters Patent is hereby corrected as shown below:

In the Claims

In Claim 1, Column 27, Line 21,

~~post-functional~~ should read post-fluctuation

Signed and Sealed this
Seventh Day of October, 2014

Michelle K. Lee
*Deputy Director of the United States Patent and Trademark Office*